United States Patent [19]
Inaba et al.

[11] Patent Number: 5,610,868
[45] Date of Patent: Mar. 11, 1997

[54] SEMICONDUCTOR MEMORY DEVICE

[75] Inventors: Tsuneo Inaba, Ichikawa; Daisaburo Takashima, Yokohama, both of Japan

[73] Assignee: Kabushiki Kaisha Toshiba, Kawasaki, Japan

[21] Appl. No.: 581,967

[22] Filed: Jan. 2, 1996

[30] Foreign Application Priority Data

Jan. 5, 1995 [JP] Japan .................................. 7-000296
Jun. 9, 1995 [JP] Japan .................................. 7-143659

[51] Int. Cl.$^6$ .................................................. G11C 7/00
[52] U.S. Cl. .......................................... 365/205; 365/208
[58] Field of Search .................................. 365/205, 207, 365/208, 190; 327/51, 52, 56, 57

[56] References Cited

U.S. PATENT DOCUMENTS

| 5,274,598 | 12/1993 | Fujii et al. ............................. | 365/205 |
| 5,353,255 | 10/1994 | Komuro ................................. | 365/149 |
| 5,430,672 | 7/1995 | Kuwabara et al. ..................... | 365/203 |

FOREIGN PATENT DOCUMENTS

| 61-82398 | 4/1986 | Japan . |
| 61-140171 | 6/1986 | Japan . |
| 61-172297 | 8/1986 | Japan . |

OTHER PUBLICATIONS

Yoshiji Ohta, et al., "A Novel Memory Cell Architecture for High–Density DRAMs", 1989 Symposium on VLSI Circuits Digest of Technical Papers, (pp. 101–102), May 25–27, 1989.

Mikio Asakura, et al., "Cell–Plate Line Connecting Complementary Bitline ($C^3$) Architecture for Battery Operating DRAMs", 1991 Symposium on VLSI Circuits Digest of Technical Papers, (pp. 59–60), May 30–Jun. 1, 1991.

W. H. Henkels, et al., "Large–Signal 2T, 1C DRAM Cell: Signal and Layout Analysis", IEEE Journal of Solid–State Circuits, vol. 29, No. 7, (pp. 829–832), Jul. 1994.

*Primary Examiner*—David C. Nelms
*Assistant Examiner*—Vu A. Le
*Attorney, Agent, or Firm*—Oblon, Spivak, McClelland, Maier & Neustadt, P.C.

[57] ABSTRACT

Disclosed is a semiconductor memory device which comprises a plurality of word lines, a plurality of bit line pairs disposed in a manner as to intersect the word lines and each having first and second bit lines, and a memory cell array having a plurality of memory cells provided at intersection areas between the plurality of bit line pairs and the plurality of word lines and each consisting of one transistor and one capacitor. The gates of the transistors are connected to the word lines, the drains thereof are connected to the first bit lines, and the sources thereof are connected to first terminals of the capacitors, second terminals of which are connected to second bit lines, thereby, at a sensing time, the amplitude of a bit line potential is set to be $\frac{1}{3}$ or less of a difference between prescribed first and second potentials, whereupon variations in potential of the first terminal of the capacitor of the memory cell are kept within a range of between the first potential and the second potential.

15 Claims, 25 Drawing Sheets

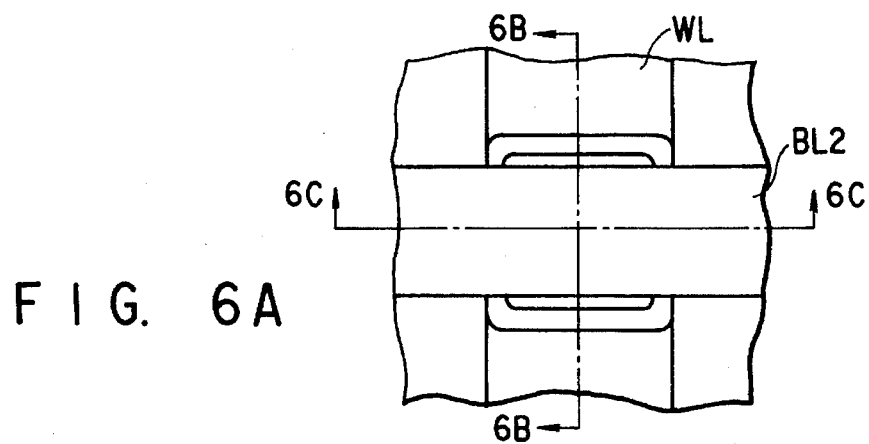
F I G. 6A
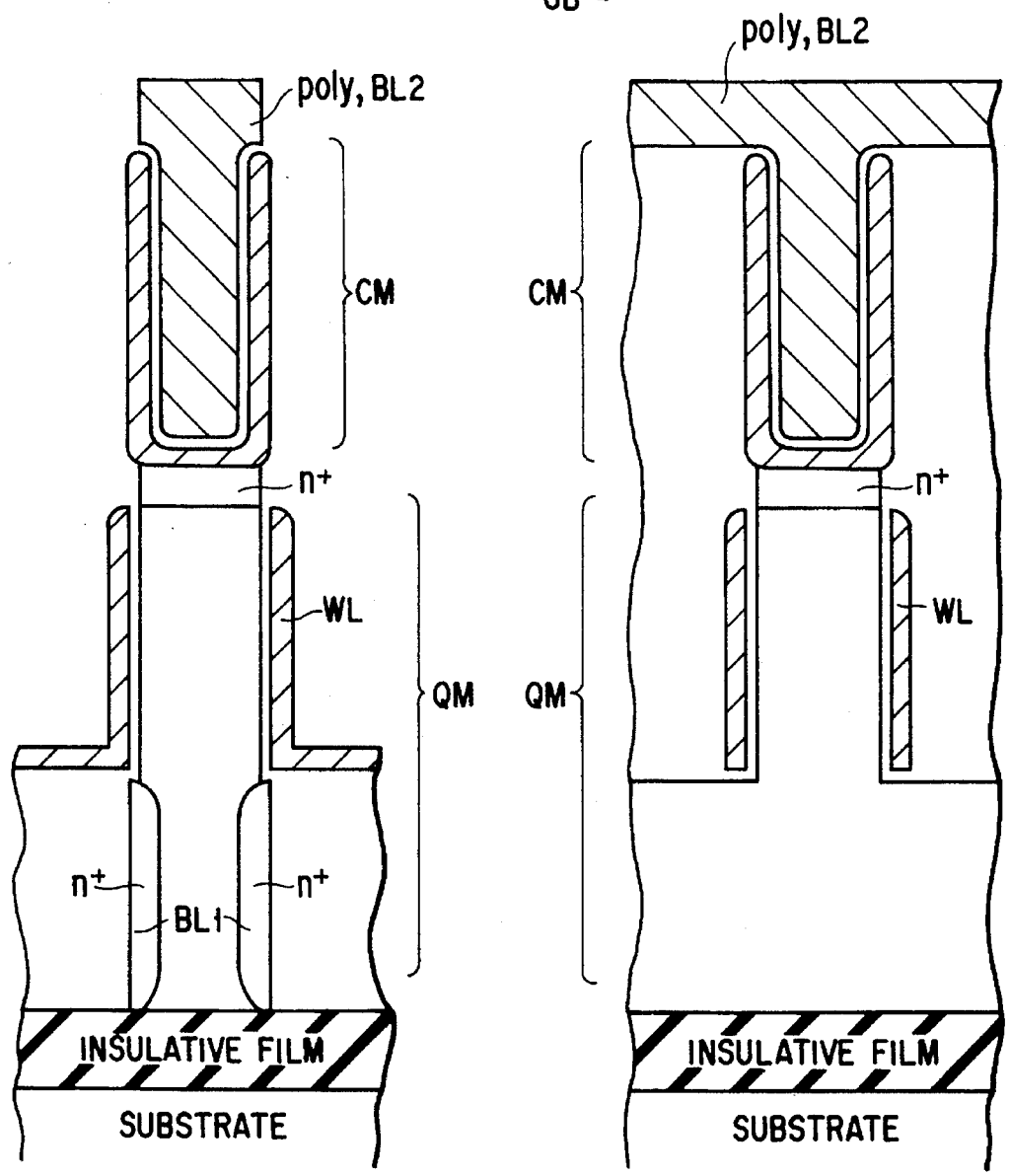
F I G. 6B    F I G. 6C

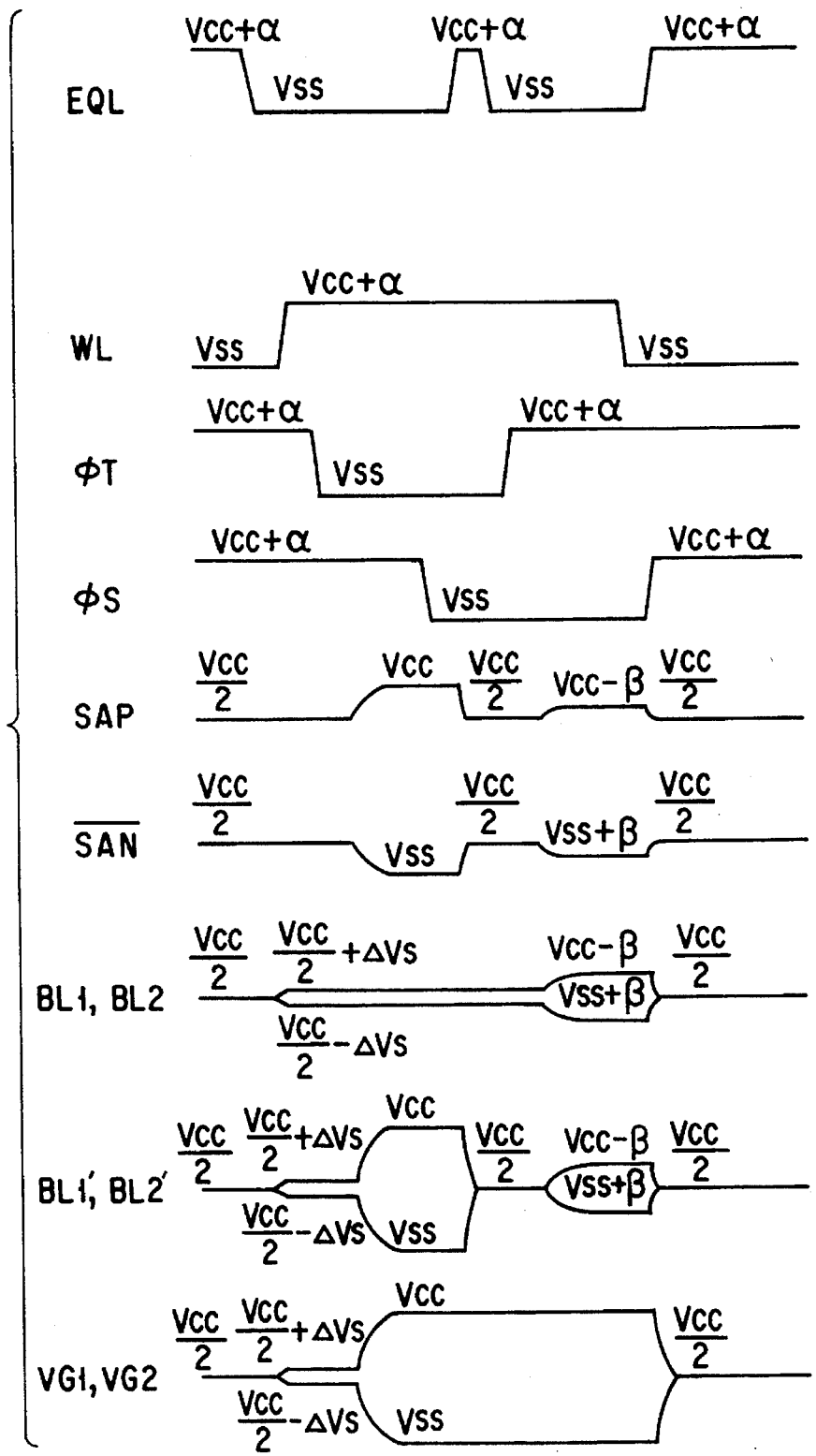
F I G. 8

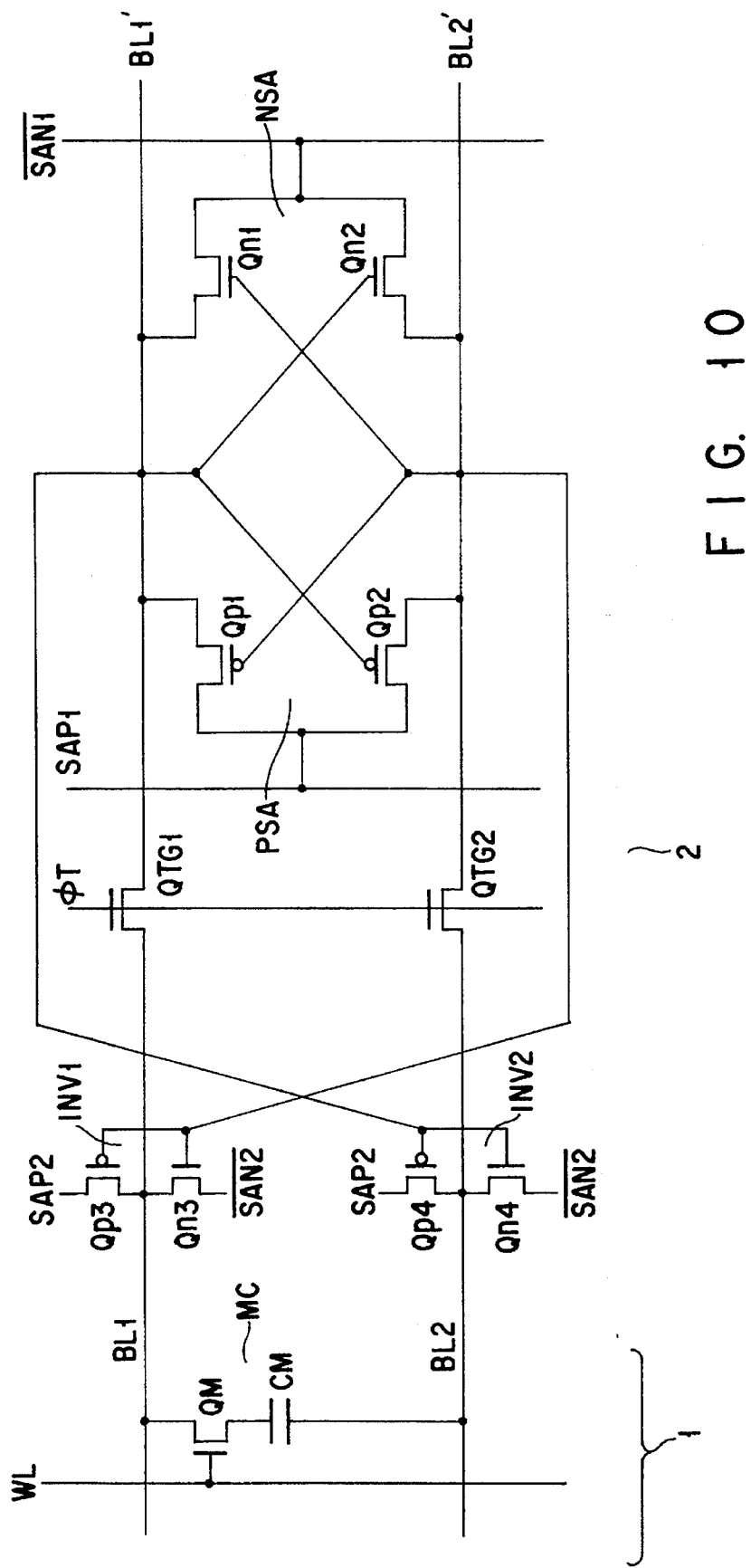
F I G. 10

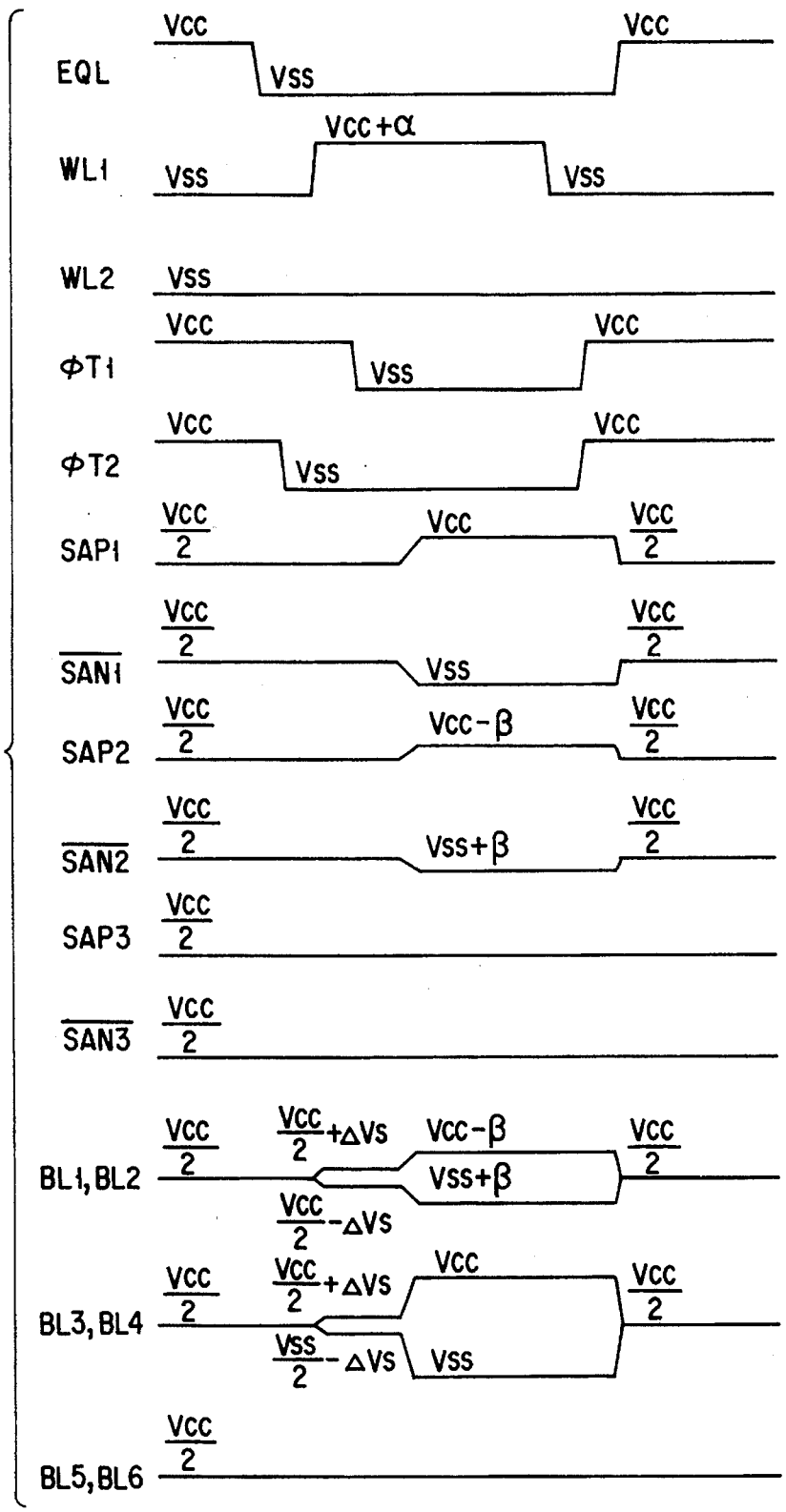
F I G. 15

5,610,868

SEMICONDUCTOR MEMORY DEVICE

BACKGROUND OF THE INVENTION

1. Field of the Invention

The present invention relates to a semiconductor memory device and, more particularly, to a semiconductor memory device which has been improved in the cell structure and sense amplifier circuit of a dynamic RAM (DRAM).

2. Description of the Related Art

The structure of a memory cell and the read-out and rewrite sequence thereof are as illustrated in FIGS. 1A and 1B, respectively. As illustrated in FIG. 1A, the gate of a cell transistor QM is connected to a word line, the drain thereof is connected to a bit line BL1, and the source thereof is connected to one end of a cell capacitor CM, the other end of which is connected to a plate electrode PL. The memory cell MC composed of the transistor QM and capacitor CM is driven by signals illustrated in FIG. 1B.

When realizing a future increase in the capacitance of DRAMs, it becomes necessary to decrease the power supply voltage in order to suppress an increase in the power consumption and ensure the reliability of the device. However, since an increase in the capacitance is followed by an increase in the current consumption, the above-mentioned conventional memory cell structure and read-out and rewrite method make it difficult to suppress the power consumption. Also, in the above-mentioned conventional memory cell, if the cell capacitance is constant, the quantity of a read-out signal decreases as the power supply voltage decreases. However, when taking it into consideration that the sensitivity of the sense amplifier has a lower limit, that the quantity of signal decreases due to α-rays, etc., a certain level and quantity of read-out signal is indispensable. This makes it necessary to increase the capacitance of the capacitor.

Meanwhile, as a sense amplifier which has been most widely employed as that of a DRAM, there is a flip-flop sense amplifier illustrated in FIG. 2. This sense amplifier has, on one hand, merits in that the circuit construction thereof is simple, etc., but has, on the other hand, a demerit in that a period necessary for performance of the sensing operation is significantly large. Also, when causing a decrease in the level of the power supply voltage which will be demanded to be realized in future, since the potential difference between the gate and source of four transistors Qn1, Qn2, Qp1 and Qp2 constituting the sense amplifier can be set to only ½ of the power supply voltage even at maximum and since it is not real to largely decrease the threshold value voltage of the transistor, the sensing operation will become again lower in speed.

For example, when the amplitude of the bit line potential is set to be 1 V, only a potential difference of 0.5 V in a worst case can be obtained between the gate and source of the sense amplifier transistors. Assuming that the threshold value voltage of the n-type transistors Qn1 and Qn2 is 0.6 V and the threshold value voltage of the p-type transistors Qp1 and Qp2 is −0.6 V, each of these transistors can no longer be operated but in a sub-threshold region, with the result that the sensing period of time largely increases, whereby a practical sensing speed can not be obtained.

Also, since the potential of the sense amplifier drive lines at a sensing time is equal to a potential for writing data into the memory cell, the both potentials can not be optimized in the form wherein they are different from each other.

As mentioned above, in the conventional DRAM, when decreasing the power supply voltage, the quantity of read-out signal for reading out data from the memory cell decreases in proportion thereto. When increasing the capacitance of the cell capacitor for the purpose of increasing the quantity of read-out signal, problems of increasing difficulty of cell capacity forming techniques, increase of cost and so on occur.

Also, in the conventional flip-flop sense amplifier, the sensing period of time is significantly large and, in addition, it is difficult to decrease the level of the power supply voltage. These problems arise from the fact that because the gates of the four transistors constituting the sense amplifier are connected to the bit lines, the potential difference between the gates of the operating transistors and the sense amplifier drive lines is impossible to obtain sufficiently.

SUMMARY OF THE INVENTION

An object of the present invention is to provide a semiconductor memory device capable of realizing a large decrease in the power consumption, high reliability, and an increase in the operating speed while ensuring a quantity of read-out signal equal to or larger than that in the case of the conventional semiconductor memory device.

Another object of the present invention is to provide a semiconductor memory device capable of achieving an increase in the speed of the sensing operation, adaptation to a decrease in the power supply voltage, and an increase in the speed of the sensing operation at a time of operation at a low power supply voltage.

In order to solve the above-mentioned problems, the present invention adopts the following constructions.

A semiconductor memory device according to a first aspect of the present invention comprises a plurality of word lines, a plurality of bit line pairs disposed in a manner as to intersect the word lines and each having first and second bit lines, and a memory cell array having a plurality of memory cells provided at intersection areas between the plurality of bit line pairs and the plurality of word lines and each consisting of one transistor and one capacitor, gates of the transistors being connected to the word lines, drains thereof being connected to the first bit lines, and sources thereof being connected to first terminals of the capacitors, second terminals of which are connected to second bit lines, wherein at a sensing time the amplitude of a bit line potential is set to be ⅓ or less of a difference between prescribed first and second potentials, whereby variations in potential of the first terminal of the capacitor of the memory cell are kept within a range of between the first potential and the second potential.

As preferred embodiment modes according to the first aspect of the present invention, there are those which follow.

(1) The first bit line is installed below the memory cell and the second bit line is installed above the memory cell.

(2) The memory cell has a vertical type structure wherein the first bit line consists of a diffusion layer of the semiconductor; an SGT (Surrounding Gate Transistor) whose drain consists of the first bit line is installed above the first bit line; the first terminal section of the cell capacitor connected to the source of the SGT is installed above the SGT; and the second bit line connected to the second terminal of the cell capacitor is installed above the cell capacitor.

According to the first aspect of the present invention, utilizing the fact that by writing data from both ends of the cell capacitor and reading out data from both ends thereof a quantity of read-out signal four times larger than that in the prior art is obtained when the bit line potential amplitude is the same, only the amplitude of the bit line potential is decreased relative to the power supply voltage. In addition, in the sensing operation, the amplitude of the bit line potential is set to ⅓ or less of the power supply voltage to thereby cause the variation in potential of the storage node to be kept within a range of between the levels of the power supply voltage and thereby prevent a potential exceeding the level range of the power supply voltage from being applied to the storage node, so that breakdown of the transistors, loss of data, etc. can be prevented. As a result, it is possible to realize a large decrease in the power consumption, high reliability, and an increase in the speed while ensuring a quantity of read-out signal equal to or more than in the prior art.

A semiconductor memory device according to a second aspect of the present invention comprises a plurality of word lines, a plurality of first bit line pairs disposed in a manner as to intersect the word lines and each having first and second bit lines, a memory cell array having a plurality of memory cells provided at intersection areas between the plurality of bit line pairs and the plurality of word lines and each consisting of one transistor and one capacitor, a plurality of second bit line pairs each having a third bit line connected to the first bit line through a first transfer gate and a fourth bit line connected to the second bit line through a second transfer gate, and flip-flop sense amplifier circuits each disposed between respective paired second bit lines of the plurality of second bit line pairs and each composed of a first p-type transistor and a first n-type transistor whose gates are commonly connected and a second p-type transistor and a second n-type transistor whose gates are commonly connected, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, the respective gates of the first p-type and first n-type transistors being connected to the fourth bit line through a third transfer gate, and the respective gates of the second p-type and second n-type transistors being connected to the third bit line through a fourth transfer gate.

As preferred embodiment modes according to the second aspect of the present invention, there are those which follow.

(1) In the operation of the sense amplifier circuit, by, after a signal from the memory cell has been read out onto the bit line, turning off the first and second transfer gates, the first bit line pair is electrically separated from the third and fourth bit lines. The potential of the first sense amplifier drive line is set to a first potential and the potential of the second sense amplifier drive line is set to a second potential, whereby the potentials of the third and fourth bit lines are sensed to the first and second potential. Thereafter, the third and fourth transfer gates are turned off to electrically separate the gates of the first n-type transistor and the first p-type transistor from the fourth bit line and electrically separate the gates of the second n-type transistor and the second p-type transistor from the third bit line, thereby storing the gate potential in each gate thereof. Thereafter, the potential of the first sense amplifier drive line is set to a third potential which is kept within a range of between the first and second potentials while, on the other hand, the potential of the second sense amplifier drive line is set to a fourth potential which is kept within a range of between the first and second potentials, whereupon the first and second transfer gates are turned on to thereby restore the third and fourth potentials into the memory cell.

(2) In the operation of the sense amplifier circuit, after storing the gate potential into each of the gates of the first and second p-type transistors and first and second n-type transistors, of the third and fourth bit lines one whose potential is the first potential is set to a potential lower than the third potential and, of the third and fourth bit lines one whose potential is the second potential is set to a potential higher than the fourth potential. Also, of the first and second sense amplifier drive lines one whose potential is the first potential is set to a potential lower than the third potential and, of the first and second sense amplifier drive lines one whose potential is the second potential is set to a potential higher than the fourth potential. Thereafter, the potential of the first sense amplifier drive line is set to the third potential which is kept within a range of between the first and second potentials and the potential of the second sense amplifier drive line is set to the fourth potential which is kept within a range of between the first and second potentials, whereupon the first and second transfer gates are turned on to thereby restore the third or fourth potential into the memory cell.

According to the second aspect of the present invention, in the sense amplifier circuit, by turning off the third and fourth transfer gates, the first and second potentials are stored into the gates of the first and second n-type and p-type transistors. As a result, the potential difference between the gates of the first and second n-type and p-type transistors and the sense amplifier drive lines can be kept large at a restorage starting time as well. As a result, it becomes possible to realize a decrease in the power supply voltage therefor, a decrease in the power consumption therefor, and an increase in the speed of the sensing operation.

A semiconductor memory device according to a third aspect of the present invention is constructed such that in the semiconductor memory device according to the second aspect thereof the first and second n-type transistors are disposed being separated from each other in the direction of the bit lines; between the first and second n-type transistors the third and fourth transfer gates are disposed being separated from each other in the direction of the bit lines; and the first and second p-type transistors are disposed between the third and fourth transfer gates.

According to the third aspect of the present invention, since the first and second n-type transistors are disposed being separated from each other outside the region in which the first and second p-type transistors are formed, only a single piece of wiring is needed for connecting the gates of the p-type and n-type transistors to each other between the relevant regions. This makes it possible to decrease the chip area.

For example, assuming that the first and second p-type transistors be formed in the same region (e.g., n-type well) and the first and second n-type transistors be formed in the same region (e.g., p-type well), two bit lines and two pieces of wiring for connecting the gates of the p-type and n-type transistors to each other are needed between these wells. Since the two pieces of wiring and the bit lines are provided in the same layer, it results that four bit lines are disposed between the wells, followed by an increase in the chip area. Also, forming the two pieces of wiring by use of a wiring separate from that of which the bit lines are formed means that the necessity of using new pieces of wiring arises. This causes an increase in the manufacturing cost and therefore is not real.

That is to say, in the present invention, the bit lines for making connection between the regions are only three in number, whereby it becomes possible to decrease the chip area.

A semiconductor memory device according to a fourth aspect of the present invention is constructed such that in the semiconductor memory device according to the second aspect thereof the first and second p-type transistors are disposed being separated from each other in the direction of the bit lines; between the first and second p-type transistors the third and fourth transfer gates are disposed being separated from each other in the direction of the bit lines; and the first and second n-type transistors are disposed between the third and fourth transfer gates.

According to the fourth aspect of the present invention, since the first and second p-type transistors are disposed being separated from each other outside the region in which the first and second n-type transistors are formed, only a single piece of wiring is needed for connecting the gates of the p-type and n-type transistors to each other between the relevant regions. This makes it possible to decrease the chip area.

A semiconductor memory device according to a fifth aspect of the present invention comprises a plurality of word lines, a plurality of first bit line pairs disposed in a manner as to intersect the word lines and each having first and second bit lines, a memory cell array having a plurality of memory cells provided at intersection areas between the plurality of bit line pairs and the plurality of word lines and each consisting of one transistor and one capacitor, a plurality of second bit line pairs each having a third bit line connected to the first bit line of the memory cell array through a first transfer gate and a fourth bit line connected to the second bit line through a second transfer gate, flip-flop sense amplifier circuits each disposed between respective paired second bit lines of the plurality of second bit line pairs and each composed of a first p-type transistor and a first n-type transistor whose gates are commonly connected to the fourth bit line and a second p-type transistor and a second n-type transistor whose gates are commonly connected to the third bit line, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, and inverter circuit composed of a third p-type transistor and a third n-type transistor having the drains commonly connected to the first bit line connected to the third bit line through the first transfer gate and the gates commonly connected to the fourth bit line and a fourth p-type transistor and a fourth n-type transistor having the drains commonly connected to the second bit line connected to the fourth bit line through the second transfer gate and the gates commonly connected to the third bit line, respective sources of the third and fourth p-type transistors being connected to a third sense amplifier drive line while, on the other hand, respective sources of the third and fourth n-type transistors are connected to a fourth sense amplifier drive line.

As preferred embodiment modes according to the fifth aspect of the present invention there are those which follow.

(1) In the operation of the sense amplifier circuit, by, after a signal from the memory cell has been read out, turning off the first and second transfer gates, the fourth bit line pair is electrically separated from the third and fourth bit lines, the potentials of the first, second, third and fourth sense amplifier drive lines are respectively set to a first, second, third and fourth potential, whereby the third or fourth potential is restored into the memory cell.

(2) In the operation of the sense amplifier circuit, the third potential is made equal to the first potential and the fourth potential to the second potential.

According to the fifth aspect of the present invention, in the sense amplifier circuit, by, after a signal from the memory cell has been read out, turning off the first and second transfer gates, the signal is sensed in only the sense amplifier section, whereupon restorage is performed by the inverter circuits. As a result, it becomes possible to realize a decrease in the power supply voltage, a decrease in the power consumption, and an increase in the speed of the sensing operation as in the case of the semiconductor memory device according to the third aspect of the present invention.

A semiconductor memory device according to a sixth aspect of the present invention comprises a plurality of word lines, a plurality of first bit line pairs disposed in a manner as to intersect the word lines and each having first and second bit lines, a memory cell array having a plurality of memory cells provided at intersection areas between the plurality of bit line pairs and the plurality of word lines and each consisting of one transistor and one capacitor, the gate of the transistor being connected to the word line, the drain thereof being connected to the first bit line, and the source thereof being connected to a first terminal of the capacitor while, on the other hand, a second terminal of the capacitor is connected to the second bit line, a plurality of second bit line pairs each having a third bit line connected to the first bit line through a first transfer gate and a fourth bit line connected to the second bit line through a second transfer gate, and flip-flop sense amplifier circuits each disposed between respective paired second bit lines of the plurality of second bit line pairs and each composed of a first p-type transistor and a first n-type transistor whose gates are commonly connected and a second p-type transistor and a second n-type transistor whose gates are commonly connected, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, the gate of the first p-type transistor being connected to the fourth bit line through a third transfer gate while, on the other hand, the gate of the second p-type transistor is connected to the third bit line through a fourth transfer gate.

As preferred embodiment modes according to the sixth aspect of the present invention, there are those which follow.

(1) In the reading-out and rewriting or restoring operation, by, after a signal from the memory cell has been read out onto the bit line pair, turning off the first and second transfer gates, the fourth bit line pair is electrically separated from the third and fourth bit lines. Whereby, the potential of the first sense amplifier drive line is set to a first potential and the potential of the second sense amplifier drive line to a second potential, thereby sensing the potentials of the third and fourth bit lines to the first and second potentials. Thereafter, by turning off the third and fourth transfer gates, the respective gates of the first n-type and p-type transistors are electrically separated from the fourth bit line and the respective gates of the second n-type and p-type transistors are electrically separated from the third bit line, thereby effecting storage of the gate potentials therein. Thereafter, the potential of the first sense amplifier drive line is set to a third potential which satisfies the equation:

(Third potential - Second potential) ≦2×(First potential - Second potential)/3, while, on the other hand, the potential of the second sense amplifier drive line is set to a fourth potential which satisfies the equation:

(Fourth potential - Second potential) ≧(First potential - Second potential)/3.

Thereafter, the first and second transfer gates are turned on, whereby these potentials are restored into the memory cell.

(2) As the construction of the sense amplifier the one referred to in the third aspect of the present invention is adopted. In the reading-out and rewriting operation, by, after a signal from the memory cell has been read out onto the third and fourth bit lines, turning off the first and second transfer gates, the third and fourth bit lines are electrically separated from the third and fourth bit lines. Whereby, the potential of the first sense amplifier drive line is set to a first potential, the potential of the second sense amplifier drive line is set to a second potential, the potential of the third sense amplifier drive line is set to a third potential which satisfies the equation:

(Third potential - Second potential) ≦2 ×(First potential - Second potential)/3, and the potential of the fourth sense amplifier drive line is set to a fourth potential which satisfies the equation:

(Fourth potential - Second potential) ≧(First potential - Second potential)/3, whereupon these potentials are restored into the memory cell.

According to the sixth aspect of the present invention, since the structure of the semiconductor memory device adopts a combined one of the structures of the semiconductor memory devices according to the first and second aspects of the present invention, the above-mentioned effects which are realized by the first and second aspects can be obtained simultaneously.

As preferred embodiment modes according to the first to sixth aspects of the present invention, there are those which follow.

(1) The memory cell has an SOI structure which is formed in a silicon layer on an insulative film.

(2) The first and second bit lines consisting one of the plurality of bit line pairs intersect with each other.

(3) The memory cell has an SGT structure which is formed by stacked transistor.

As mentioned above, by using the memory cell structure and sense/restore system of the present invention, it becomes possible to realize a semiconductor memory device capable of achieving a large decrease in the power consumption, high reliability, and an increase in the operating speed while ensuring a quantity of read-out signal equal to or more than in the prior art. Also, by modifying the layout content of the sense amplifier, it is possible to use only a single piece of wiring for connecting the gates of the p-type and n-type transistors to each other between the relevant regions, thereby decreasing the chip area.

Also, according to the sense amplifier and sensing system of the present invention, it is possible to achieve a decrease in the sensing time period, adaptation to a decrease in the power supply voltage, and an increase in the speed of the sensing operation during a low power supply voltage operation. Further, it is also possible to make differentiation between the amplitude of the bit line potential in the sense amplifier section and the amplitude of the bit line potential in the cell array section.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 6A to 6C are views illustrating the element structure of a memory cell according to a third embodiment;

FIG. 8 is a view illustrating the operation of the sense amplifier according to the fourth embodiment;

FIG. 10 is a circuit construction diagram illustrating a sense amplifier according to a fifth embodiment;

FIG. 15 is a view illustrating the operation of the sense amplifier according to the seventh embodiment;

DETAILED DESCRIPTION OF THE PREFERRED EMBODIMENTS

Embodiments of the present invention will now be explained hereunder with reference to the drawings.

EMBODIMENT 1

Figure 3:
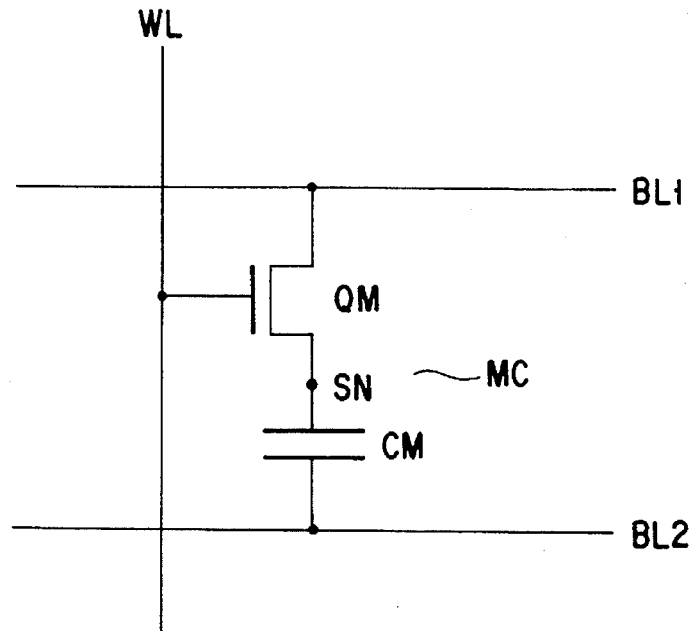
FIG. 3 is a circuit construction diagram illustrating a memory cell of a semiconductor memory device according to a first embodiment.

FIG. 3 is a circuit construction diagram illustrating a memory cell of a semiconductor memory device according to a first embodiment of the present invention.

BL1 and BL2 represent bit lines of a cell array section which constitute a bit line pair and WL represents a word line. A memory cell MC is installed at a point of intersection between the bit line pair and the word line. The memory cell MC is composed of a cell transistor QM and a cell capacitor CM. The drain of the cell transistor QM is connected to the bit line BL1, the gate thereof is connected to the word line WL, and the source thereof is connected to a first terminal of the cell capacitor CM, a second terminal of which is connected to the bit line BL2. Also, a symbol SN represents a storage node.

Figure 4A:
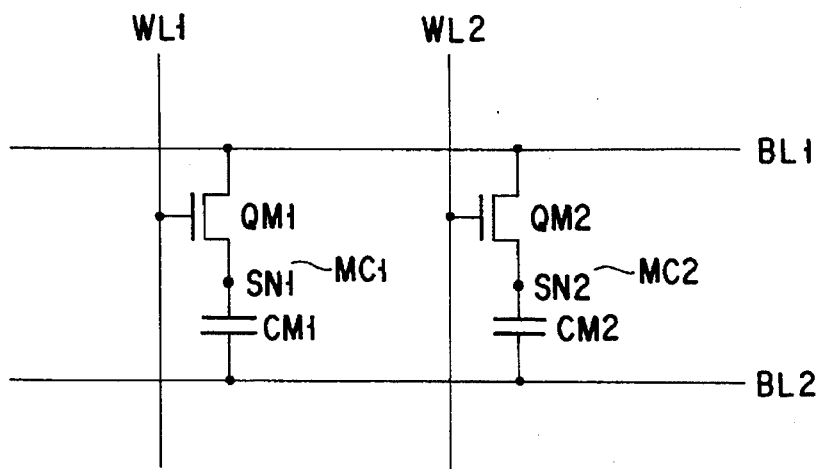
FIGS. 4A and 4B are views illustrating a reading-out and rewriting operation in the first embodiment.
Figure 4B:
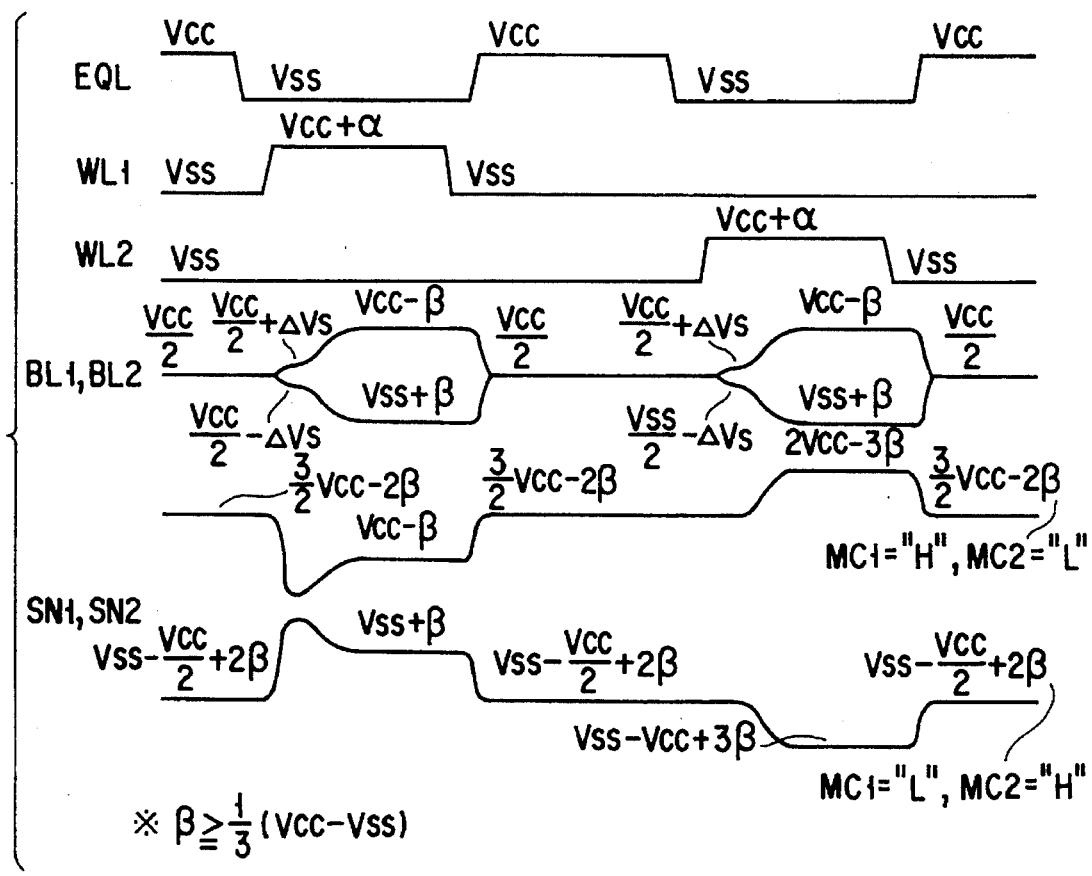

The reading-out and rewriting operation of the memory cell will be explained below with reference to FIGS. 4A and 4B. FIG. 4A illustrates two memory cells and FIG. 4B illustrates drive signals. During a precharge cycle, the potential of word lines WL1 and WL2 is Vss, the potential of an equalizing signal EQL is Vcc, and the potential of bit lines BL1 and BL2 is Vcc/2. Thereafter, when the equalizing signal EQL becomes Vss and as a result the word line WL1 is selected to become Vcc+α, a signal is read out from the memory cell MC1 onto the bit lines BL1 and BL2, so that the potentials of the bit lines BL1 and BL2 become Vcc/2+ΔVs and Vcc/2–ΔVs.

Note that this refers to a case where the signal thus read out is high in level. Namely, in a case where a signal low in level has been read out, the potentials of the bit lines BL1 and BL2 become Vcc/2–ΔVs and Vcc/2+ΔVs. In the following description, reference will be made to read-out of a signal high in level, and the potentials of the bit lines BL1 and BL2 in a case of read-out of a signal low in level are represented by being parenthesized like "[]".

Next, by driving the sense amplifier, the potentials of the bit lines BL1 and BL2 are set to Vcc–β and Vss+β[Vss+β, Vcc–β], respectively, thereby effecting restorage thereof into the memory cell MC1. Note here that it is necessary for β to satisfy a relationship of β≧(Vcc–Vss)/3. Thereafter, the potential of the word line WL1 is set to Vss and the potential of the equalizing signal EQL is set to Vcc, whereupon equalization is performed. At this time, since the storage node SN1 is in a state of floating, the potential thereof becomes 3×Vcc/2–2β[Vss–Vcc/2+2β].

Considering now a case where reverse data to that in the memory cell MC1 is recorded in a memory cell MC2, when data in the memory cell MC2 has been read out in the same manner as mentioned above, the potential of the storage node SN1 at a rewriting time becomes 2 Vcc–3β[Vss–Vcc+3β]. Since the potential of the storage node SN1 at this time becomes Vcc (Vss) when β=Vcc/3, the above requirement of β is determined accordingly. Also, the quantity of read-out signal ΔVs from the memory cell is approximately ⅔ times as large as that from the conventional memory cell when β=Vcc/3, and becomes equal thereto when β=3×Vcc/8.

EMBODIMENT 2

Figure 5:
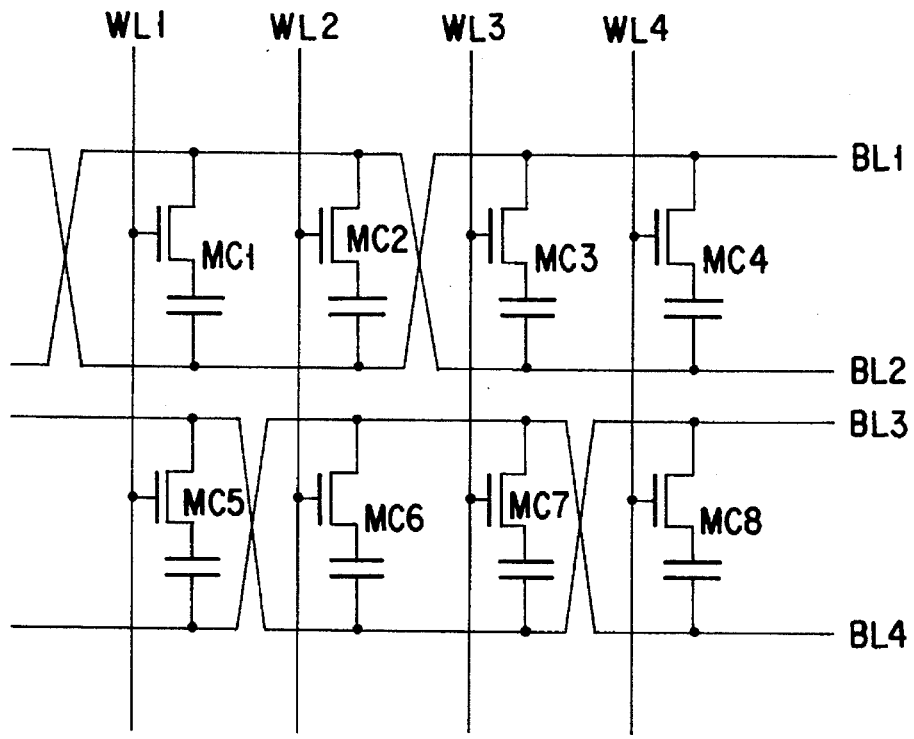
FIG. 5 is a circuit construction diagram illustrating a memory cell and a memory cell array according to a second embodiment.

FIG. 5 is a circuit construction diagram illustrating a memory cell and memory cell array according to a second embodiment of the present invention.

In this embodiment, bit lines BL1 and BL2 and bit lines BL3 and BL4 are caused to cross each other respectively, thereby installing all of their corresponding memory cells in the same direction, thereby equalizing the capacitances of the bit lines BL1 and BL2 (and those of the bit lines BL3 and BL4) constituting a bit line pair with each other.

EMBODIMENT 3

FIGS. 6A to 6C illustrate the element structure of a memory cell according to a third embodiment of the present invention. FIG. 6A is a plan view of the memory cell, taken from above the same, FIG. 6B is a sectional view thereof taken along the line 6B—6B of FIG. 6A, and FIG. 6C is a sectional view thereof taken along the line 6C—6C of FIG. 6A.

In this embodiment, the element is prepared using an SOI substrate. Namely, a cell transistor QM is installed on an insulative film formed on a substrate, and a cell capacitor CM is installed over this cell transistor QM. As the cell transistor QM there is used an SGT (Surrounding Gate Transistor) which is a vertical type transistor, and the drain thereof formed by a high concentration impurity layer simultaneously forms a lower bit line. Over the source of the cell transistor QM formed by a high concentration impurity layer a first terminal of the cell capacitor CM is installed to form a storage node. A second terminal of the cell capacitor CM is connected to an upper bit line BL2.

By making the memory cell into this vertical cell structure, it is possible to realize a $4F^2$-sized memory cell, thus to realize an increase in the density and degree of integration of the memory cell.

EMBODIMENT 4

Figure 7:
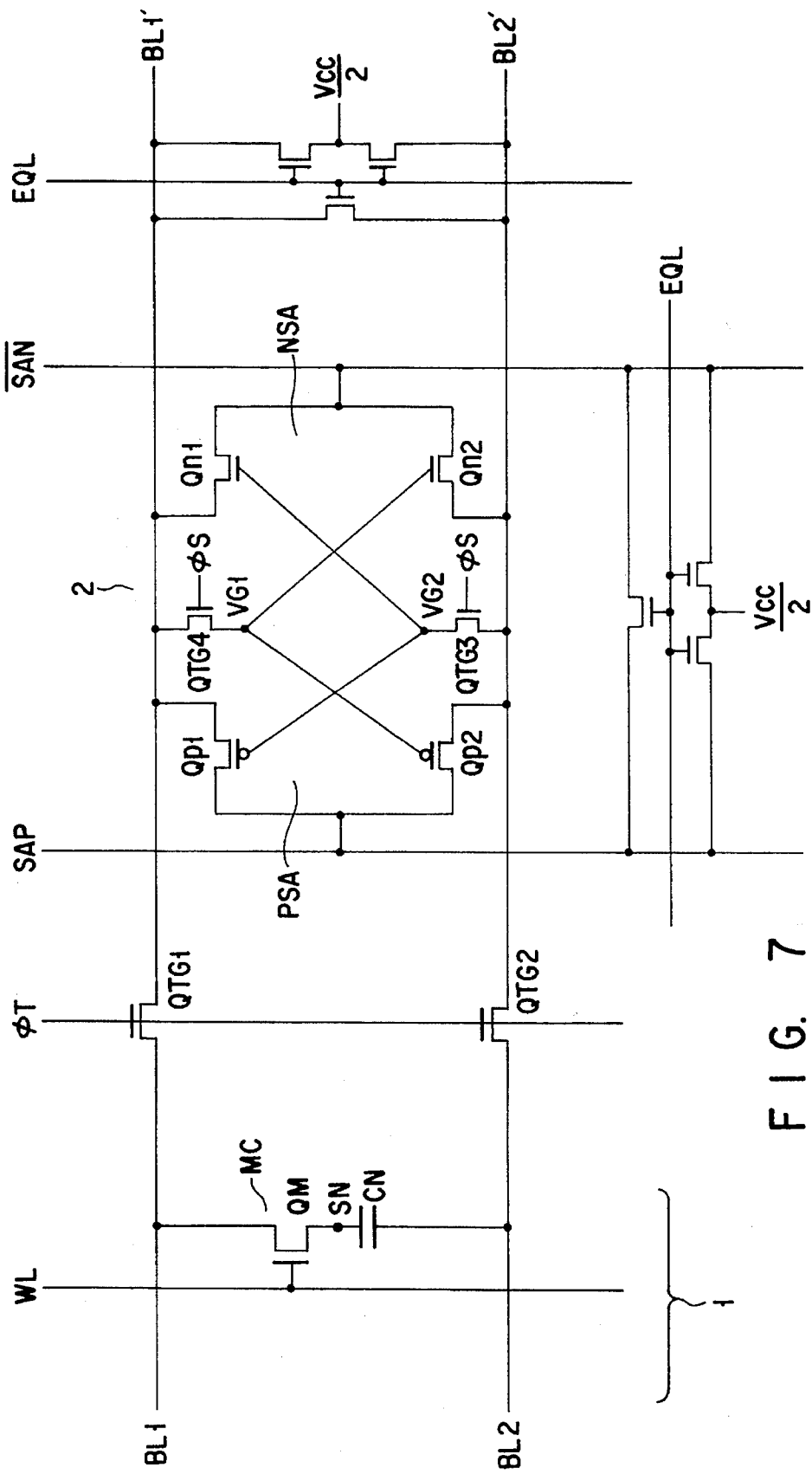
FIG. 7 is a circuit construction diagram illustrating a sense amplifier and memory cell according to a fourth embodiment.

FIG. 7 is a circuit construction diagram illustrating a sense amplifier and memory cell according to a fourth embodiment of the present invention. BL1 and BL2 represent a bit line pair of a cell array section, and a plurality of memory cells are disposed at points of intersection between the bit lines and word lines. BL1' and BL2' represent a bit line pair of a sense amplifier section the bit lines of which are connected to the bit lines BL1 and BL2 through transfer gates QTG1 and QTG2, respectively.

Between the bit lines BL1' and BL2', there are disposed a p-type sense amplifier PSA composed of p-type transistors Qp1 and Qp2 and an n-type sense amplifier NSA composed of n-type transistors Qn1 and Qn2. One of the drain and source of each of the transistors Qp1 and Qp2 is connected to a p-type sense amplifier drive line SAP and the other thereof is connected to a corresponding one of the bit lines BL1' and BL2'. One of the drain and source of each of the transistors Qn1 and Qn2 is connected to an n-type sense amplifier drive line/SAN and the other thereof is connected to a corresponding one of the bit lines BL1' and BL2'. The gates of the transistors Qp1 and Qn1 are connected to the bit line BL2' through a transfer gate QTG3 and the gates of the transistors Qp2 and Qn2 are connected to the bit line BL1' through a transfer gate QTG4.

Also, the transfer gates QTG1 and QTG2 are each controlled by a control signal $\phi T$ and the transfer gates QTG3 and QTG4 are each controlled by a control signal $\phi S$. The potential of the bit lines and the potential of the sense amplifier drive lines are each equalized with an intermediate potential Vcc/2 of the power supply voltage by means of an equalizing signal EQL.

The operation of this sense amplifier will now be explained with reference to FIG. 8.

During a precharge cycle, the potential of the word line Vss and clock signals $\phi T$ and $\phi S$ is Vcc+α and the potential of the equalizing signal EQL is Vcc+α. Therefore, the respective potentials of the bit lines BL1 and BL2 of the cell array section, the bit lines BL1' and BL2' of the sense amplifier section, the sense amplifier drive lines/SAN and SAP and the gates VG1 and VG2 of the transistors constituting the p-type sense amplifier and n-type sense amplifier each become Vcc/2. Thereafter, when the equalizing signal EQL has become Vss whereby the word line WL is selected to Vcc +α, a signal from the memory cell is read out onto the bit lines BL1, BL2, BL1' and BL2' with the result that the potential of the bit lines BL1 and BL1' becomes Vcc/2+ΔVs and the potential of the bit lines BL2 and BL2' becomes Vcc/2–ΔVs.

Note that this refers to a case where the read out signal is high in level. In a case where a signal low in level has been read out, the potential of the bit lines BL1 and BL1' becomes Vcc/2–ΔVs and the potential of the bit lines BL2 and BL2' becomes Vcc/2+ΔVs. Here in this embodiment, the succeeding operation will be stated on the assumption that a high level signal has been read out as in the preceding embodiments.

By setting the clock signal $\phi T$ to Vss, the bit lines BL1 and BL2 of the cell array section are electrically separated from the bit lines BL3 and BL4 of the sense amplifier section. Thereby, the circuit operation is limited to the sensing operation performed in the sense amplifier section alone with the p-type sense amplifier drive line SAP and n-type sense amplifier drive line/SAN being respectively set to be Vcc and Vss. Thereafter, by setting the clock signal $\phi S$ to Vss, the gate potentials are stored in the gates VG1 and VG2 of the four transistors Qp1, Qp2, Qn1 and Qn2 constituting the p-type sense amplifier and n-type sense amplifier. Thereafter, by setting the potential of the equalizing signal EQL to Vcc+α, the potential of the sense amplifier drive lines SAP and/SAN and the potential of the bit lines BL1' and BL2' of the sense amplifier section are equalized with each other to a potential of Vcc/2. At this time as well, the potentials of the gates VG1 and VG2 of the transistors Qp1, Qp2, Qn1 and Qn2 constituting the p-type sense amplifier PSA and n-type sense amplifier NSA are maintained to be Vcc and Vss, respectively.

After equalization, the potential of the equalizing signal EQL is set to Vss, the potential of the clock signal $\phi T$ is set to Vcc+α, the potential of the p-type sense amplifier drive line SAP is set to Vcc–β, and the potential of the n-type sense amplifier drive line/SAN is set to Vss+β, thereby writing data into the memory cell. Thereafter, the word line WL is set to Vss and the equalizing signal EQL to Vcc+α.

When in the above-mentioned operation the potentials of the gates VG1 and VG2 of the four transistors Qp1, Qp2, Qn1 and Qn2 constituting the n-type sense amplifier and p-type sense amplifier are stored therein, since the bit lines BL1 and BL2 of the cell array section are electrically separated, the capacitance thereof is small. For this reason, the sensing operation at this time is performed at a high speed.

Also, since at a time of rewriting data into the memory cell the potentials of the gates VG1 and VG2 are kept to be Vcc and Vss respectively regardless of the amplitude of the bit line potentials, a large potential difference is attained between the gate and source of the transistor, whereby the rewriting operation is performed at a high speed. In addition, at a time of rewriting data into the memory cell, the range of β is set such that β≧(Vcc–Vss)/3, thereby making the potentials of the bit lines to be Vcc–β and Vss+β respectively and thereby making the variations in potential of the storage node of the memory cell to be kept within a range of between Vcc and Vss.

As a result of this, the reliability of the memory cell is ensured while, on the other hand, a low power consumption is realized by decreasing the amplitude of the bit line potentials.

The reading-out of data to the outside of the chip can be performed at a sensing time when the clock signal $\phi T$ is turned off or at a rewriting time when the clock signal $\phi T$ is turned on. Also, writing of data into the memory cell from the outside thereof can be performed by, after turning on the clock signal $\phi S$ and thereby storing reverse data into the gates VG1 and VG2, turning off the clock signal $\phi S$.

Figure 9:
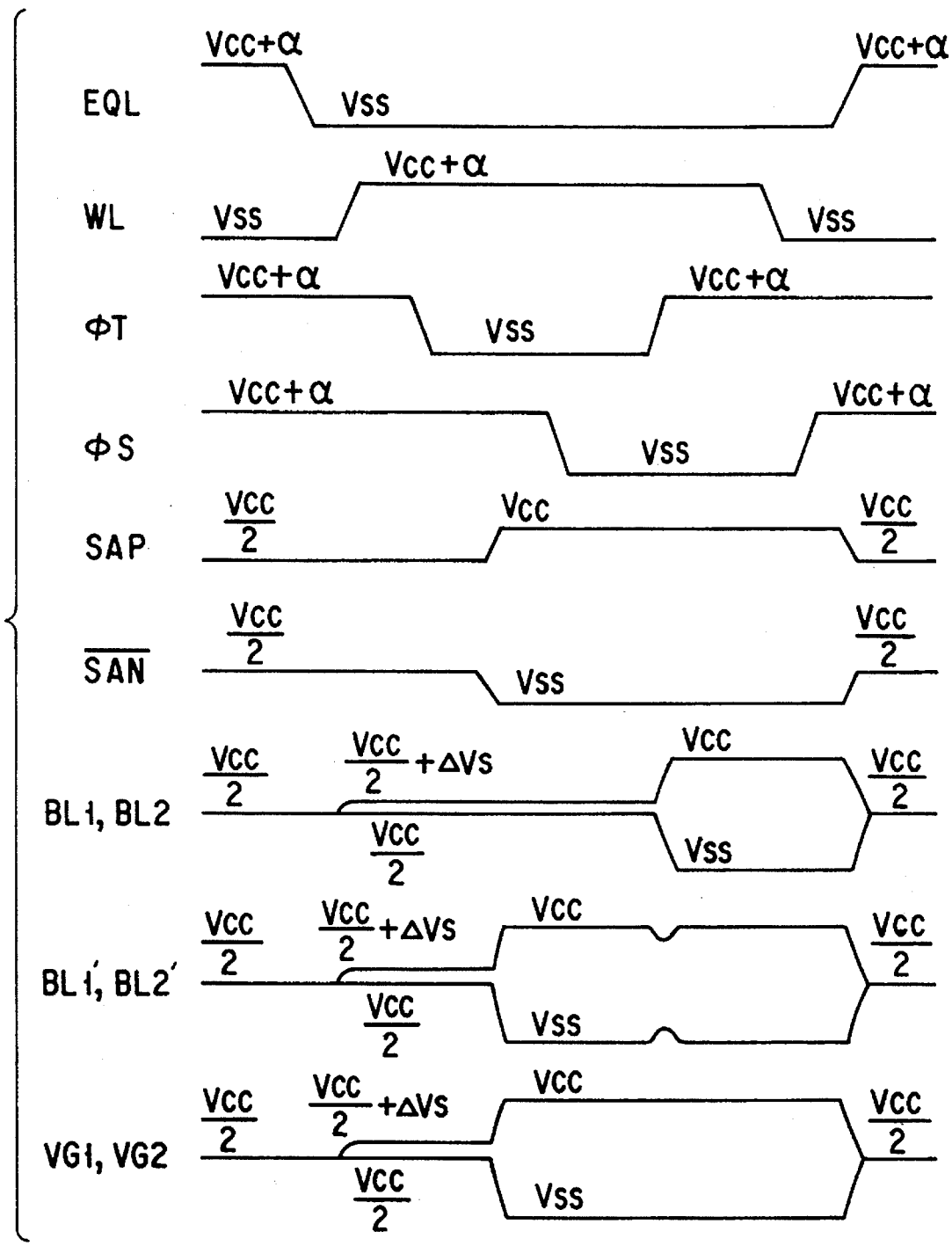
FIG. 9 is a view illustrating another operation thereof which stands basically on the operational waveforms of FIG. 8.

FIG. 9 illustrates another operation which stands basically on the operational waveforms of FIG. 8.

The difference between this example of the operation and the operation illustrated in FIG. 8 is as follows.

(1) Whereas in the preceding example at a time of rewriting data into the memory cell the potential of the p-type sense amplifier SAP is set to Vcc–β and the potential of the n-type sense amplifier drive line SAP is set to Vss+β, in this example the p-type sense amplifier SAP is set to Vcc and the n-type sense amplifier/SAN is set to Vss.

(2) Whereas in the preceding example prior to rewriting data into the memory cell the potential of the bit line pair BL1 and BL2 of the sense amplifier section and the potential of the sense amplifier drive lines SAP and/SAN are equalized with each other to an intermediate potential Vcc/2, in this example such equalizations are not done.

In this example, when the bit lines BL1 and BL2 of the cell array section and the bit lines BL1' and BL2' of the sense amplifier section are electrically connected with each other by making the clock signal φT "on", the potential difference between the bit lines BL1' and BL2' decreases from Vcc. In a case where the gates VG1 and VG2 and the bit lines BL1' and BL2' are connected at all times with each other as in the prior art, the potentials of the gates VG1 and VG2 also change in level with the result that the potential difference between the sense amplifier drive line and the gate decreases and as a result the speed at which data is rewritten decreases.

In contrast, in this example, since the potential of the gates VG1 and VG2 is maintained as is even when the potential of the bit lines BL1' and BL2' has fluctuated, the potential difference between the sense amplifier drive line and the gate is maintained to be Vcc, whereby restorage is performed at a high speed.

EMBODIMENT 5

FIG. 10 is a circuit construction diagram illustrating a sense amplifier according to a fifth embodiment of the present invention. BL1 and BL2 represent a bit line pair of a cell array section and, at points of intersection between a word line WL and this bit line pair, a plurality of memory cells are disposed. BL1' and BL2' represent a bit line pair of a sense amplifier section, the bit lines of which are connected to the bit lines BL1 and BL2 through transfer gates QTG1 and QTG2. Between the bit lines BL1' and BL2' there are disposed a p-type sense amplifier PSA composed of p-type transistors Qp1 and Qp2 and an n-type sense amplifier NSA composed of n-type transistors Qn1 and Qn2.

The gates of the transistors Qp1 and Qn1 are connected to the bit line BL2' and the gates of the transistors Qp2 and Qn2 are connected to the bit line BL1'. One of the drain and source of each of the transistors Qp1 and Qp2 is connected to a p-type sense amplifier drive line SAP1 and the other thereof is connected to a corresponding one of the bit lines BL2' and BL1'. One of the drain and source of the transistors Qn1 and Qn2 is connected to an n-type sense amplifier drive line/SAN1 and the other thereof is connected to a corresponding one of the bit lines BL2' and BL1'.

An inverter circuit NV1 is composed of a p-type transistor Qp3 and an n-type transistor Qn3. The source of the transistor Qp3 is connected to a sense amplifier drive line SAP2 and the source of the transistor Qn3 is connected to a sense amplifier drive line/SAN2. The drains of the transistors Qp3 and Qn3 are connected to each other and also connected to the bit line BL1. The gates of the transistors Qp3 and Qn3 are connected to each other and also connected to the bit line BL2'.

An inverter circuit INV2 is composed of a p-type transistor Qp4 and an n-type transistor Qn4. The source of the transistor Qp4 is connected to a sense amplifier drive line SAP2 and the source of the transistor Qn4 is connected to a sense amplifier drive line/SAN2. The drains of the transistors Qp4 and Qn4 are connected to each other and also connected to the bit line BL2. The gates of the transistors Qp4 and Qn4 are connected to each other and also connected to the bit line BL1'. Also, transfer gates QTG1 and QTG2 are each controlled by a control signal φT.

Figure 11:
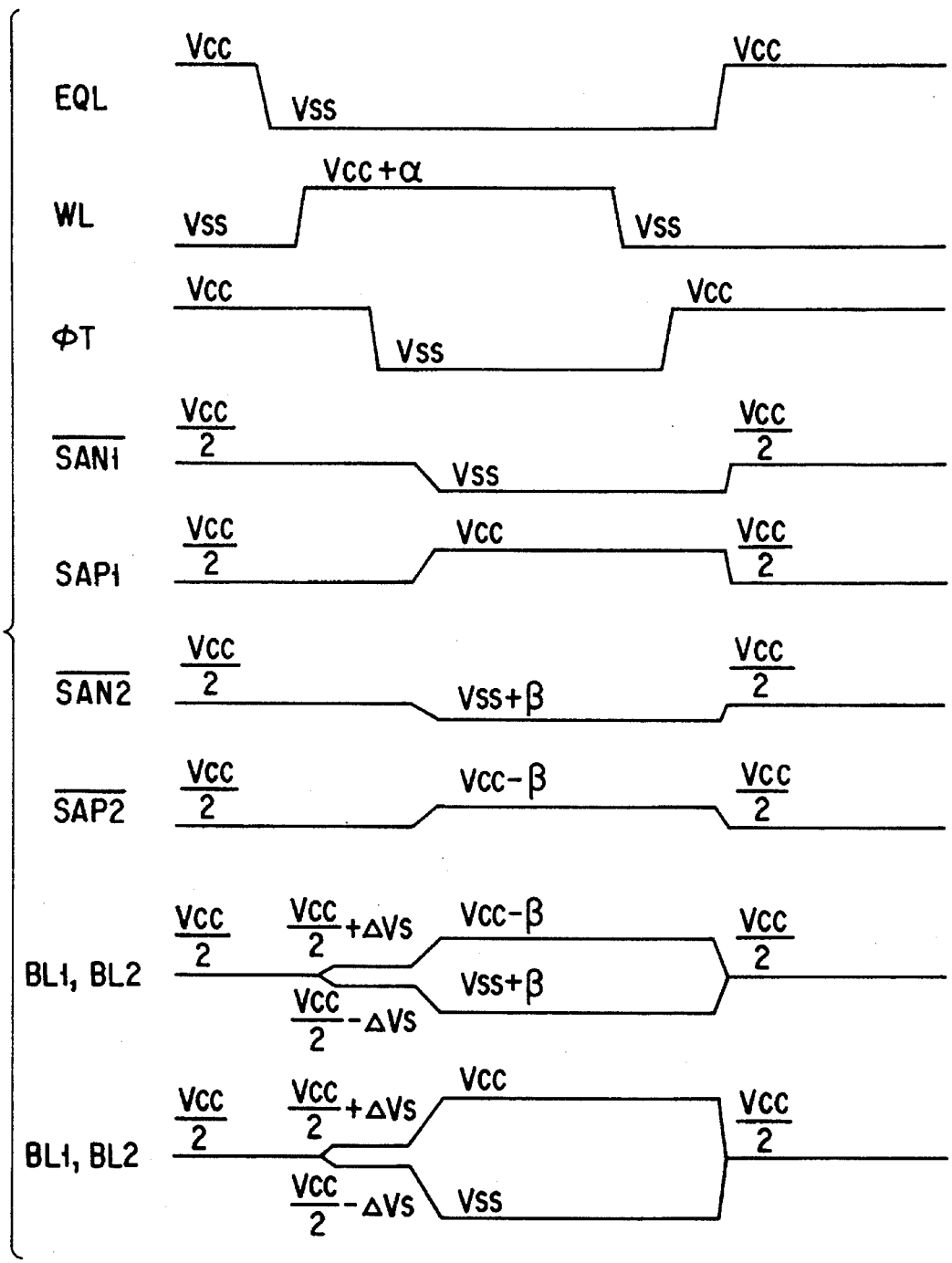
FIG. 11 is a view illustrating the operation of the sense amplifier according to the fifth embodiment.

The operation of the sense amplifier according to this embodiment will now be explained with reference to FIG. 11.

During a precharge cycle, the potentials of the word line WL, clock signal φT and equalizing signal EQL are Vss, Vcc+α and Vcc, respectively. The respective potentials of the bit lines BL1 and BL2 of the cell array section, bit lines BL1' and BL2' of the sense amplifier section, and sense amplifier drive lines SAP1, SAP2,/SAN1 and SAN2 are Vcc/2. Thereafter, when the equalizing signal EQL has become Vss and then the word line WL has been selected to a potential of Vcc+α, a signal is read out from the memory cell onto the bit lines BL1, BL2, BL1' and BL2', whereby the potential of the bit lines BL1 and BL1' becomes Vcc/2+ΔVs and the potential of the bit lines BL2 and BL2' becomes Vcc/2–ΔVs.

Note that this refers to a case where the read out signal is high in level. In a case where a signal low in level has been read out, the potential of the bit lines BL1 and BL1' becomes Vcc/2–ΔVs and the potential of the bit lines BL2 and BL2' becomes Vcc/2+ΔVs. Here in this embodiment, reference is made, as an example, to a case where a high level signal is read out.

By setting the potential of the clock signal φT to Vss, the bit lines BL1 and BL2 of the cell array section and the bit lines BL1' and BL2' of the sense amplifier section are electrically separated from each other. Thereafter, the potential of the p-type sense amplifier drive lines SAP1 is set to Vcc and the potential of the n-type sense amplifier drive line /SAN1 to Vss, thereby causing the performance of the sensing operation in the sense amplifier section. At this time, by setting the potentials of the sense amplifier drive lines SAP 2 and/SAN2 to Vcc–β and Vss+β(β≧(Vcc–Vss)/3) respectively, the inverter circuits INV1 and INV2 are activated to thereby set the potentials of the bit lines BL1 and BL2 of the cell array section to be Vcc–β and Vss+β, whereupon restorage into the memory cell is performed. Thereafter, the potential of the word line WL is set to Vss and that of the equalizing signal EQL to Vcc.

During the above-mentioned operation, at a time of the sense amplifier operation, since the bit lines BL1' and BL2' of the sense amplifier section are electrically separated from the bit lines BL1 and BL2 of the cell array section, the bit line capacitance becomes small. Therefore, the sensing operations of the sense amplifiers PSA and NSA are performed at a high speed. Also, while restorage into the memory cell is performed by the inverter circuits INV1 and INV2, the rewriting operation is also performed at a high speed because rewriting operation is performed simultaneously with the start of the sensing operations of the sense amplifiers PSA and NSA.

Also, in the inverter circuits INV1 and INV2, since a signal independent of the signal applied to the sense amplifier drive lines is applied to the sense amplifier drive lines SAP2 and/SAN2, which results in that the variations in the potential of the storage node of the memory cell are kept within a range of between Vcc and Vss, the reliability of the operation is ensured. Also, since the amplitude of the bit line potential is decreased, a decrease in the power consumption is realized.

EMBODIMENT 6

Figure 12:
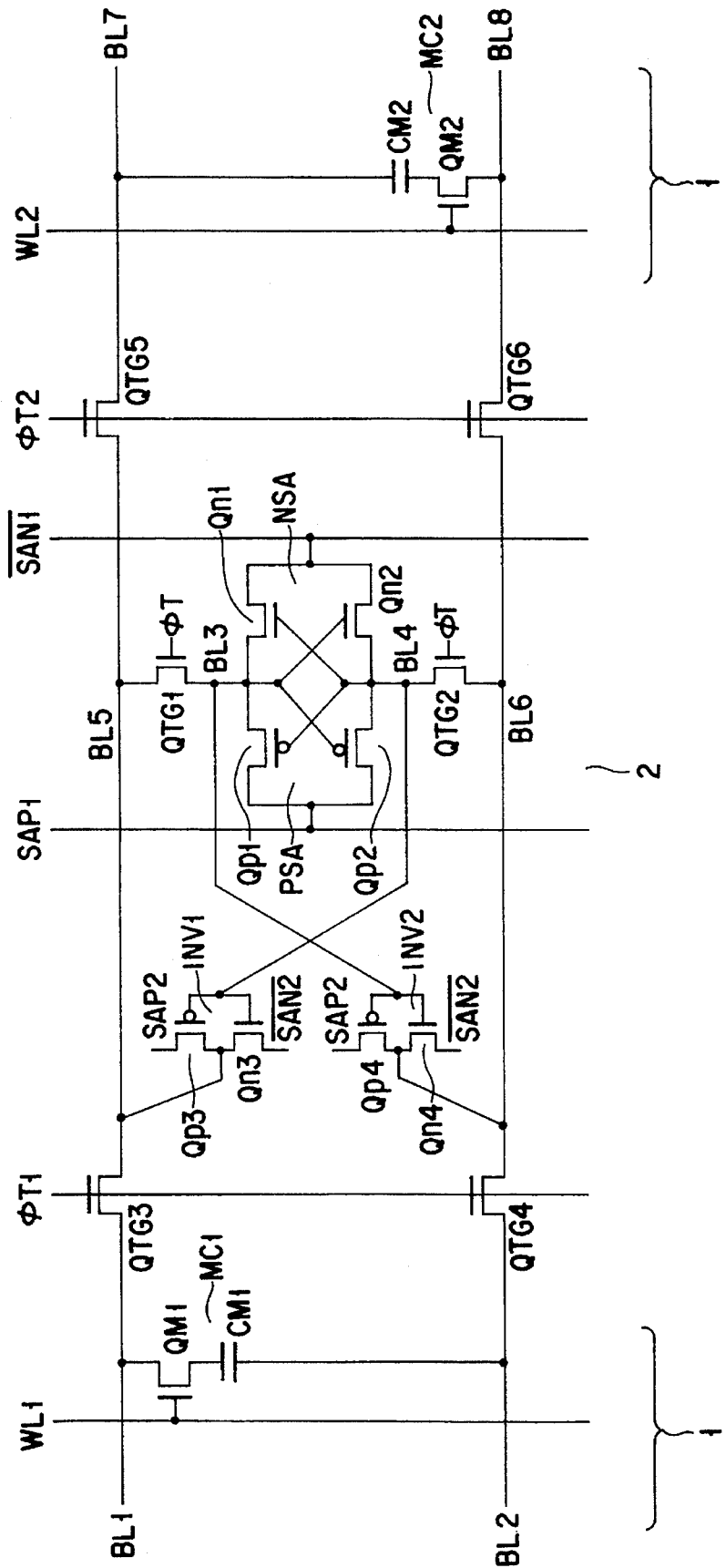
FIG. 12 is a circuit construction diagram illustrating a sense amplifier according to a sixth embodiment.

FIG. 12 is a circuit construction diagram illustrating a sense amplifier according to a sixth embodiment of the present invention. In this embodiment, bit lines BL5 and BL6 to which there are connected output terminals of data writing inverter circuits INV1 and INV2 are made electrically separable from bit lines BL3 (BL1') and BL4 (BL2') of the cell array section. That is, this embodiment is one wherein the fifth embodiment as stated previously is applied to the circuit construction of a so-called "shared sense amplifier system" in which a single sense amplifier is shared by a plurality of cell arrays.

The operation of the sense amplifier according to this embodiment will now be explained with reference to FIG. 13.

Figure 13:
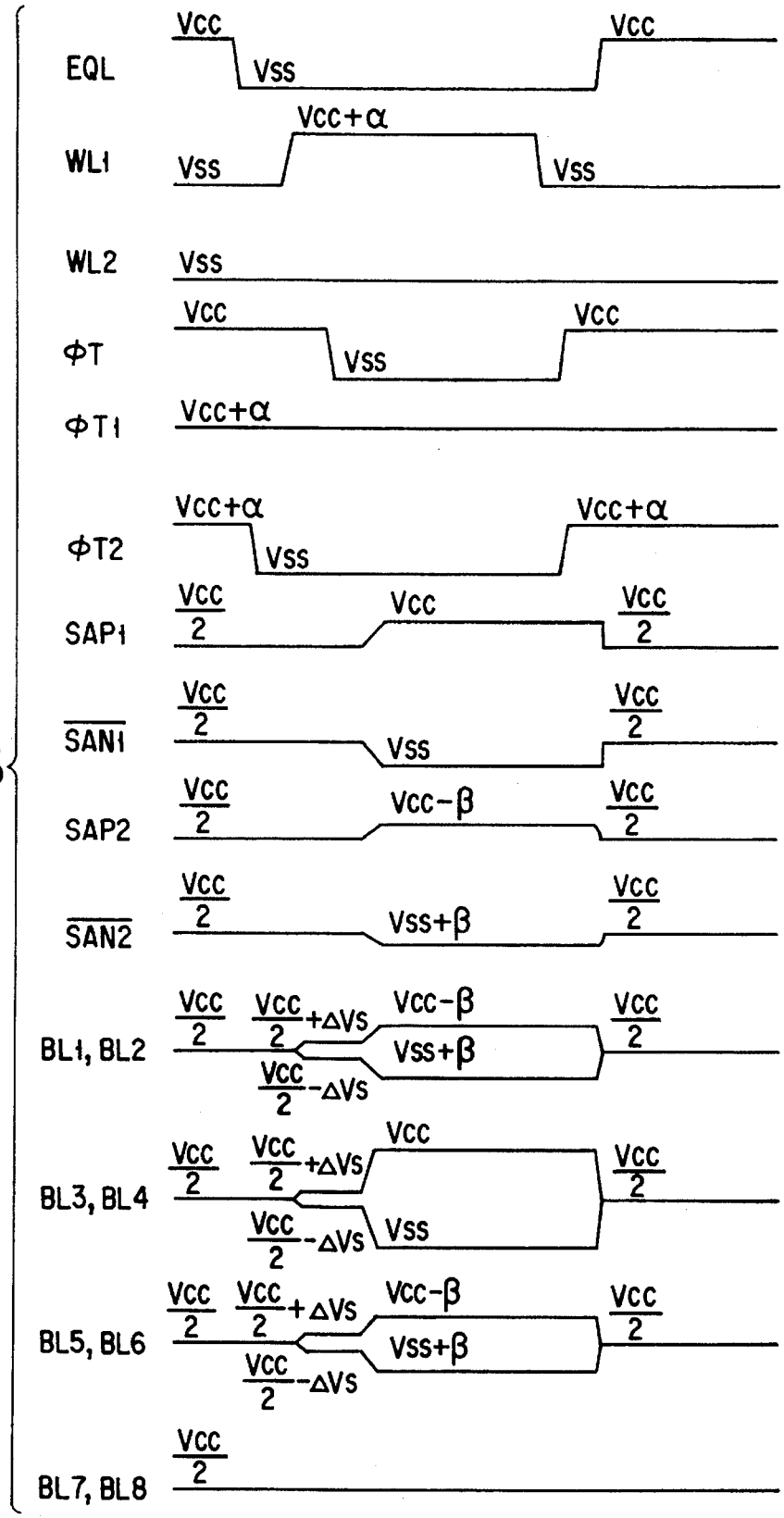
FIG. 13 is a view illustrating the operation of the sense amplifier according to the sixth embodiment.

FIG. 13 illustrates operational waveforms in the case of reading out and rewriting data from and into a memory cell MC1 on the left side of the sense amplifier in FIG. 12. This embodiment differs from the previously stated fifth embodiment in that by, after the potential of the equalizing signal EQL has become Vss and the equalizing operation has been completed, turning off the transfer gates QTG5 and QTG6, an operation of electrically separating from the bit lines BL5 and BL6 bit lines BL7 and BL8 connected to a memory cell from which no data is read out is performed.

EMBODIMENT 7

Figure 14:
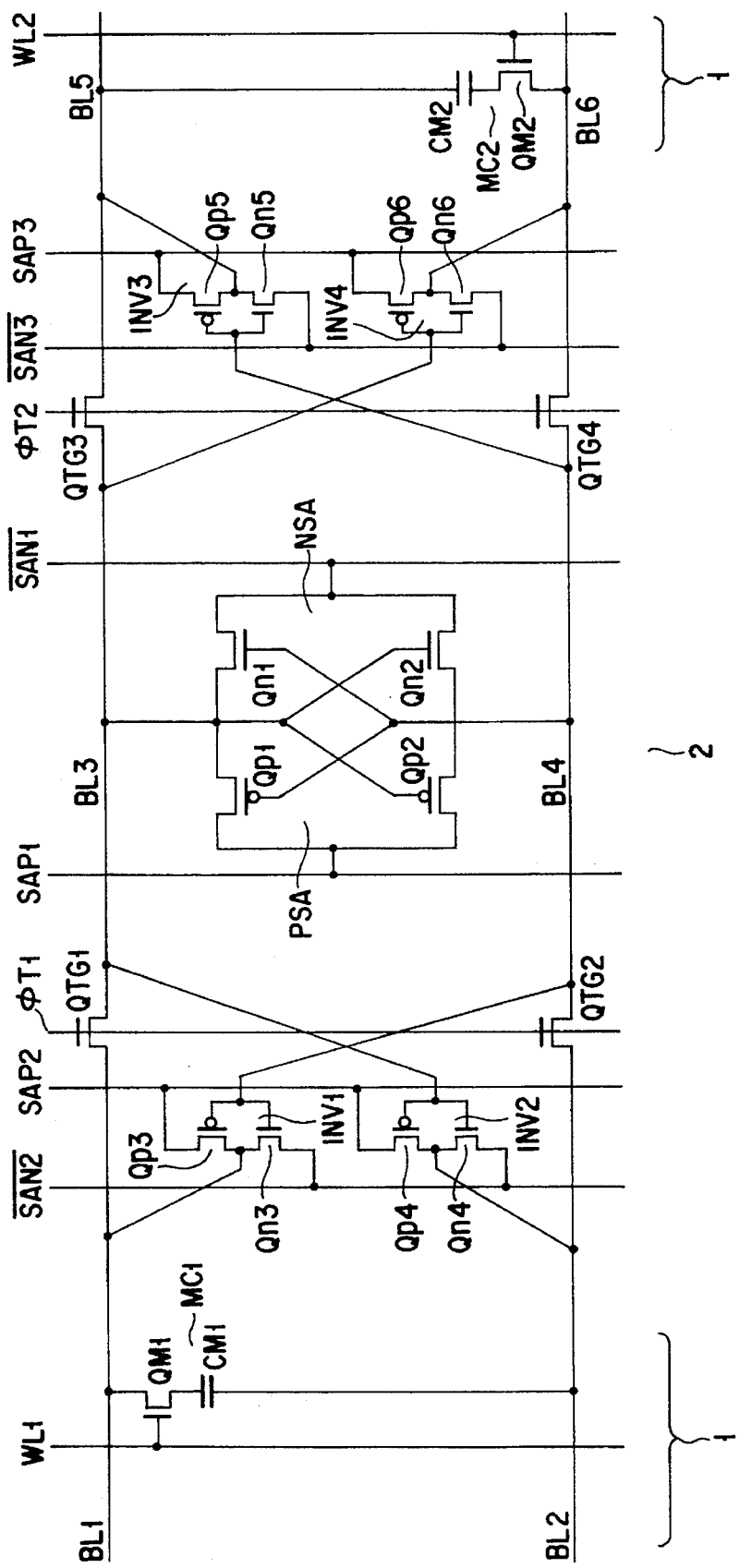
FIG. 14 is a circuit construction diagram illustrating a sense amplifier according to a seventh embodiment.

FIG. 14 is a circuit construction diagram illustrating a sense amplifier according to a seventh embodiment of the present invention. This embodiment also adopts a so-called "shared sense amplifier system" as in the preceding sixth embodiment. Whereas in the sixth embodiment a memory cell from and into which data is read out and rewritten is selected by the transfer gates, in this embodiment a plurality of rewriting inverter circuits are provided whereby only the rewriting inverter circuits connected to a memory cell from and into which data is read out and rewritten are operated, thereby achieving adaptation to the shared sense amplifier system.

Transfer gates QTG1–QTG2 and QTG3–QTG4 are provided on respective both ends of the bit lines BL3 and BL4 of the sense amplifier section, respectively. The bit lines BL3 and BL4 are connected to the bit lines BL1 and BL2 of the cell array section and to the bit lines BL5 and BL6 thereof through these transfer gates. Rewriting inverter circuits are installed one pair with respect to each cell array. A drive line pair SAP2 and/SAN2 and a drive line pair SAP 3 and /SAN3 for the inverter circuits are respectively installed with respect to inverter pairs.

The operation of the sense amplifier according to this embodiment will now be explained with reference to FIG. 15.

FIG. 15 illustrates operational waveforms in the case of reading out and rewriting data of the memory cell MC1 on the left side of the sense amplifier illustrated in FIG. 14. After the potential of the equalizing signal EQL has become Vss whereby the equalizing operation has been completed, the bit lines BL5 and BL6 of the cell array from and into which no data is read out and rewritten are electrically separated by turning off the transfer gates QTG3 and QTG4. Thereafter, after the potential of the selected word line WL1 is set to Vcc+α to thereby read out data of the memory cell onto the bit lines, the transfer gates QTG1 and QTG2 are turned off to perform electrical separation between the bit lines BL1 and BL2 of the cell array section and the bit lines BL3 and BL4 of the sense amplifier section.

Next, the sensing operation is performed by setting the potentials of the sense amplifier drive lines SAP1 and/SAN1 to Vcc and Vss. Also, restorage is performed by setting the potentials of the rewriting inverter circuit drive lines SAP2 and/SAN2 to be Vcc−β and Vss+β($\beta \geq$(Vcc−Vss)/3) respectively. At this time, no change is made to the potentials of the sense amplifier drive lines SAP3 and/SAN3.

Note that the present invention is not limited to each of the above-mentioned embodiments. The sense amplifier circuits of FIGS. 7, 10, 12 and 14 explained in the preceding embodiments can be applied not only to the memory cell such as that illustrated in FIG. 3 but also to a DRAM having an ordinary memory cell structure wherein a second terminal of the cell capacitor is connected to the plate electrode. Also, the memory cell structure is not limited to the one illustrated in FIGS. 6A to 6C but can be suitably modified according to relevant specifications. Also, the present invention can be executed by being variously modified without departing from the subject matter of the present invention.

EMBODIMENT 8

Figure 16:
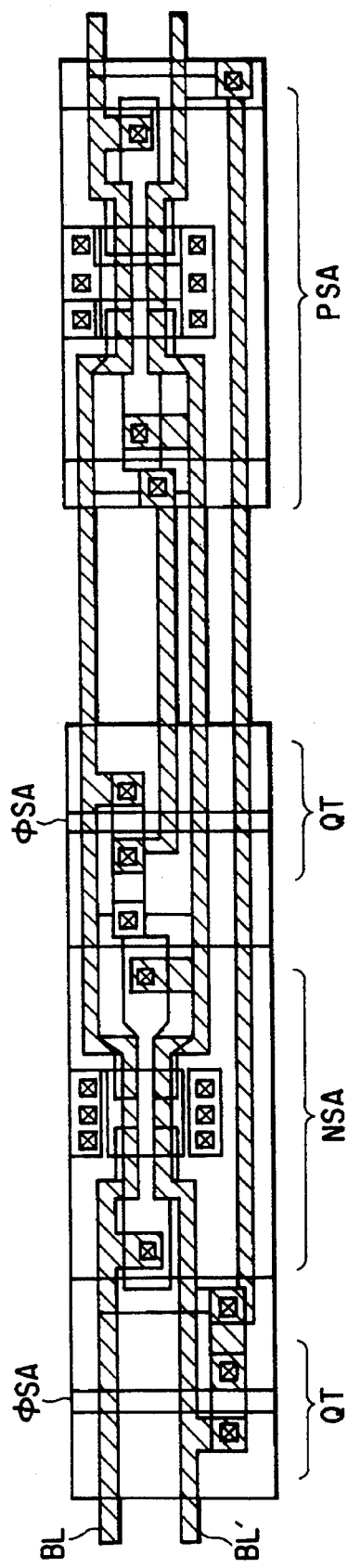
FIG. 16 is a representative layout view of the sense amplifier according to the fourth embodiment.

In the sense amplifier (FIG. 7) according to the previously stated fourth embodiment, the gates of the n-type transistors and p-type transistors constituting the n-type and p-type sense amplifiers are connected to each other. Therefore, in the conventional method of disposing the transistors, in order to connect the gates of the n-type transistors and p-type transistors, there arises the necessity of newly disposing two bit lines for making gate connection in addition to the original bit lines as illustrated in FIG. 16. As a result of this, the area of the sense amplifier is more increased by at least the wiring width of the bit lines and the wiring-to-wiring space interval thereof than in the prior art. Also, when wirings other than the bit lines are used for connecting the gates of the n-type transistors and p-type transistors to each other, since the wiring layer as conventionally used can not be used from the viewpoint of construction, it becomes necessary to form a new wiring layer. This is not real when viewed from the standpoint of the manufacturing cost and the like.

As mentioned above, when the sense amplifier having the circuit construction as illustrated in FIG. 7 is installed by use of the conventional sense amplifier transistor disposition method, the area needed for installation thereof is large. This is because the gates of the n-type transistors constituting the n-type sense amplifier and the gates of the p-type transistors constituting the n-type sense amplifier are connected to each other.

Figure 1A:
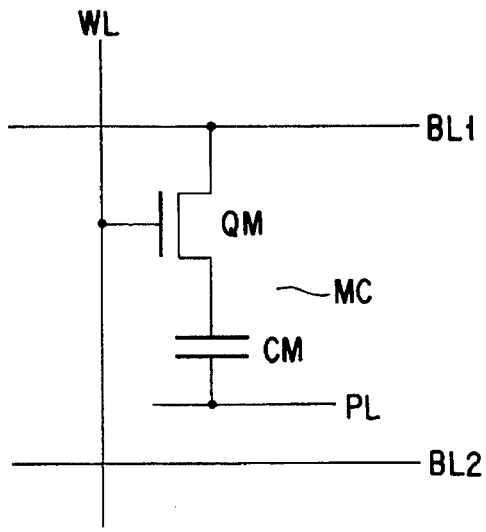
FIGS. 1A and 1B are views illustrating a conventional structure of a memory cell and a corresponding read-out and rewrite sequence.
Figure 1B:
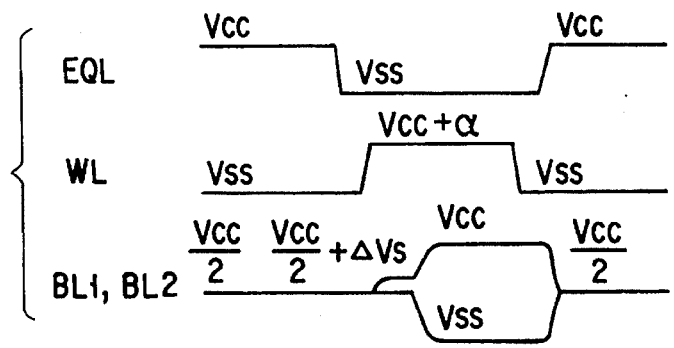
Figure 2:
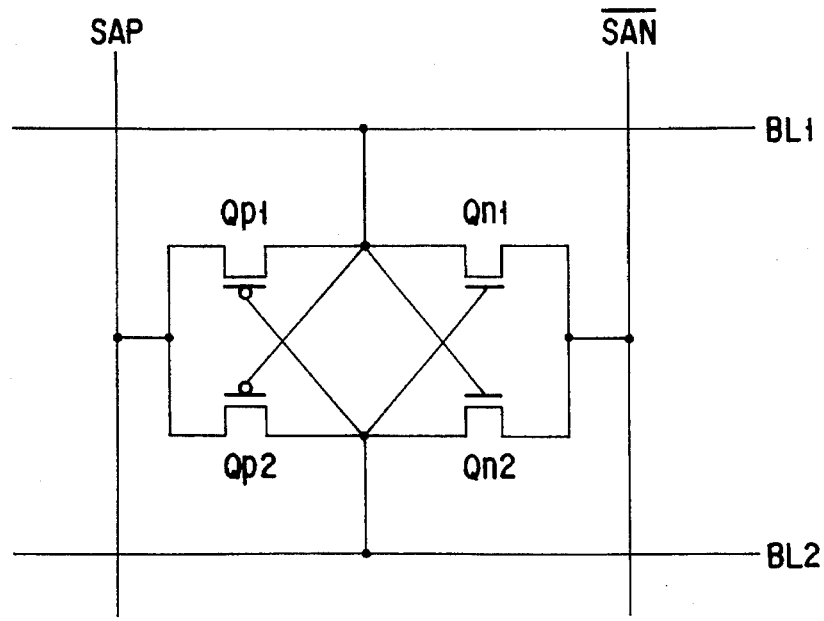
FIG. 2 is a circuit construction diagram illustrating a conventional flip-flop sense amplifier.

For this reason, this embodiment is intended, in the installation of the sense amplifier having the circuit construction as illustrated in FIG. 7, to make the width of the sense amplifier as viewed in a direction perpendicular to the length direction of the bit lines substantially equal to that in the case where a representative flip-flop sense amplifier illustrated in FIG. 2 has been installed by the conventional method.

Figure 17:
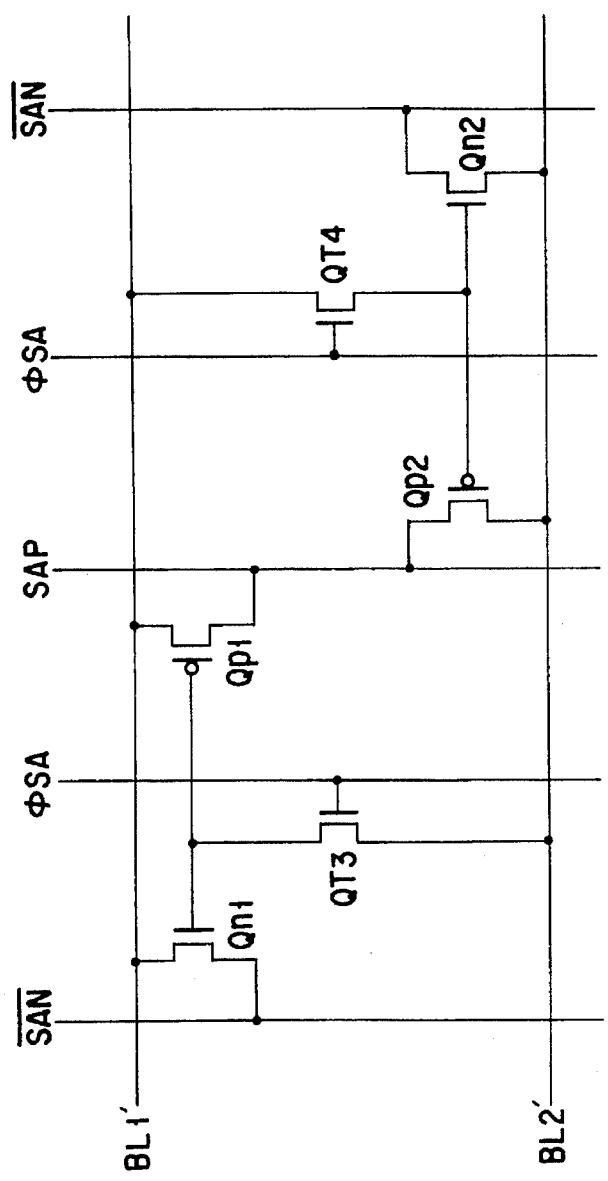
FIG. 17 is a circuit construction diagram illustrating the transistor disposition of a sense amplifier according to an eighth embodiment.

FIG. 17 illustrates by a typical circuit diagram the transistor disposition of a sense amplifier according to an eighth embodiment of the present invention. Although not illustrated in this figure, a bit line pair BL1' and BL2' of the sense amplifier section is connected to a bit line pair BL1 and BL2 of the cell array section through transfer gates QTG1 and QTG2 in the same manner as in FIG. 7.

Between the bit lines BL1' and BL2' there are disposed n-type transistors Qn1 and Qn2 constituting an n-type sense amplifier, p-type transistors Qp1 and Qp2 constituting a p-type sense amplifier, and transfer gates QTG3 and QTG4. Although the connection relationship between the transistors is the same as that in the case of FIG. 7, in this embodiment the transistors Qn1 and Qn2 are disposed being separated from each other in the direction of the bit lines. Also, between these transistors Qn1 and Qn2 the transfer gates QTG3 and QTG4 are disposed being separated from each other. Further, between the transfer gates QTG3 and QTG4 the transistors Qp1 and Qp2 are disposed.

Figure 18:
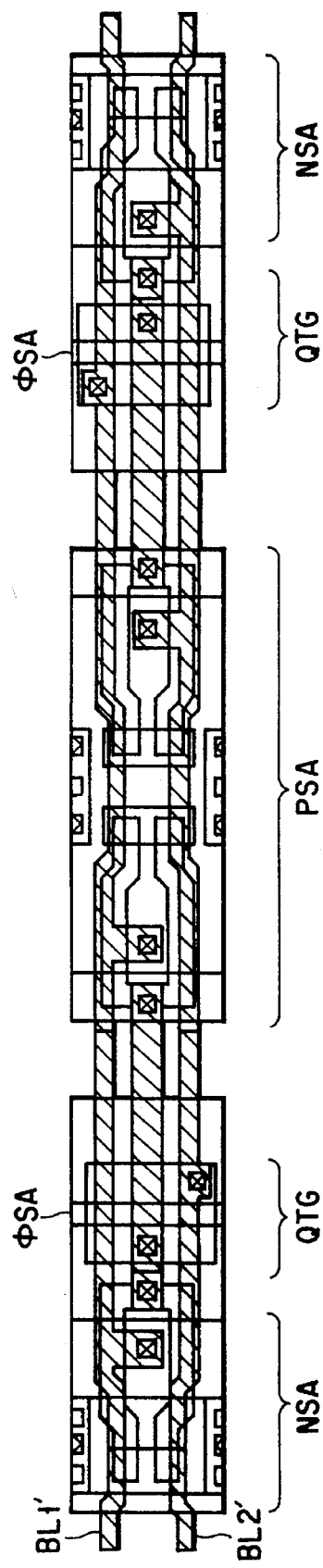
FIG. 18 is a layout view of the sense amplifier illustrated in FIG. 17.

FIG. 18 is a layout view illustrating the sense amplifier circuit illustrated in FIG. 17. Two transfer gates QTG are disposed between two sections of the sense amplifier NSA composed of the n-type transistors Qn disposed being divided into two parts, and the sense amplifier PSA composed of the p-type transistors Qp is disposed between these two transfer gates.

By making the above-mentioned dispositions, it is possible to reduce the number of bit lines connecting the regions (an n-well region in which the transistors Qp1 and Qp2 have been formed, a p-well region in which the transistor Qn1 and the transfer gate QTG3 have been formed, and a p-well region in which the transistor Qn2 and the transfer gate QTG4 have been formed) to a smaller number of bit lines (two bit lines and a single piece of wiring for connecting the gate of the p-type transistor and the gate of the n-type transistor). As a result, it becomes possible to reduce the chip area.

Figure 19:
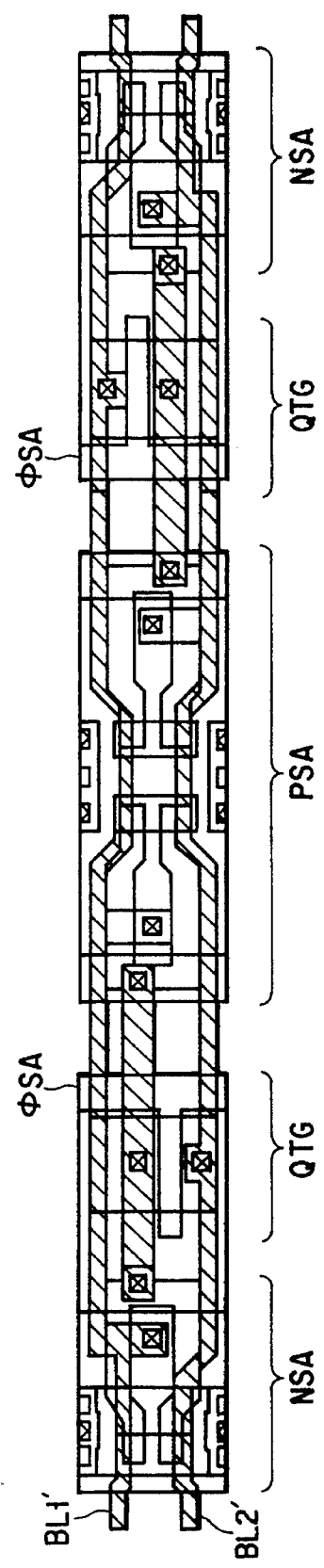
FIG. 19 is another layout view of the sense amplifier illustrated in FIG. 17.

FIG. 19 is another layout view illustrating the sense amplifier circuit illustrated in FIG. 17. The layout view of FIG. 19 differs from that of FIG. 18 only in that the gate pattern of the transfer gate QTG in FIG. 19 is modified from that of the transfer gate QTG in FIG. 18 but is completely the same as the layout view of FIG. 18 in other respects. By making this disposition, it is possible to reduce the number of bit lines connecting the regions and also to reduce the chip area, as in the case of the layout disposition made in FIG. 18.

EMBODIMENT 9

Figure 20:
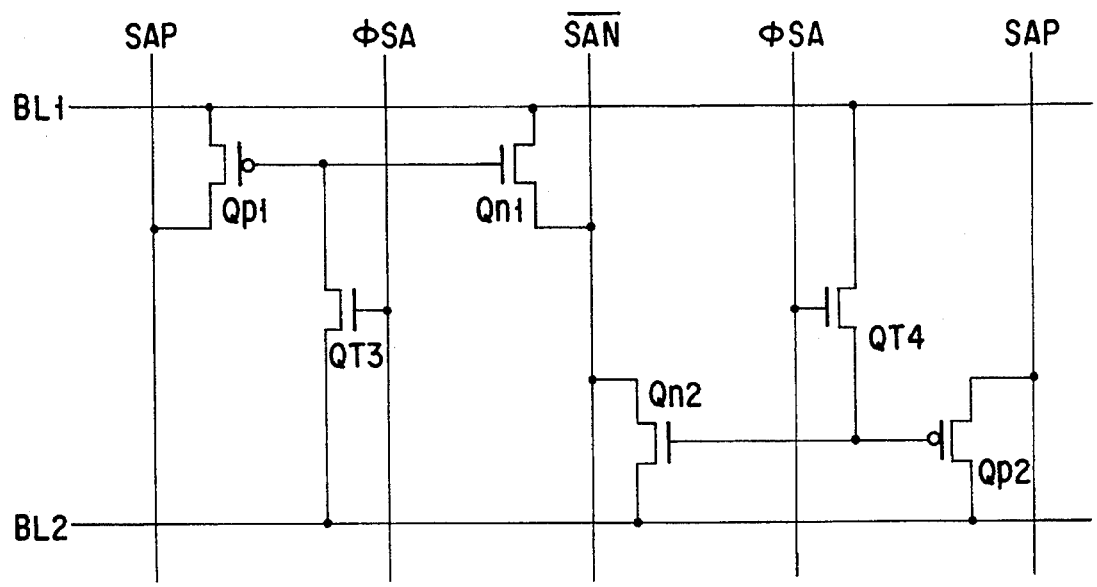
FIG. 20 is a circuit construction diagram illustrating the transistor disposition of a sense amplifier according to a ninth embodiment.

FIG. 20 is a typical circuit diagram illustrating a transistor disposition of a sense amplifier according to a ninth embodiment of the present invention. The connection relationship is substantially the same as that illustrated in FIG. 17. However, in this embodiment, transistors Qp1 and Qp2 are disposed being separated from each other in the direction of the bit lines. Also, between these transistors Qp1 and Qp2 transfer gates QTG3 and QTG4 are disposed being separated from each other. Further, between these transfer gates QTG3 and QTG4 transistors Qn1 and Qn2 are disposed.

Figure 21:
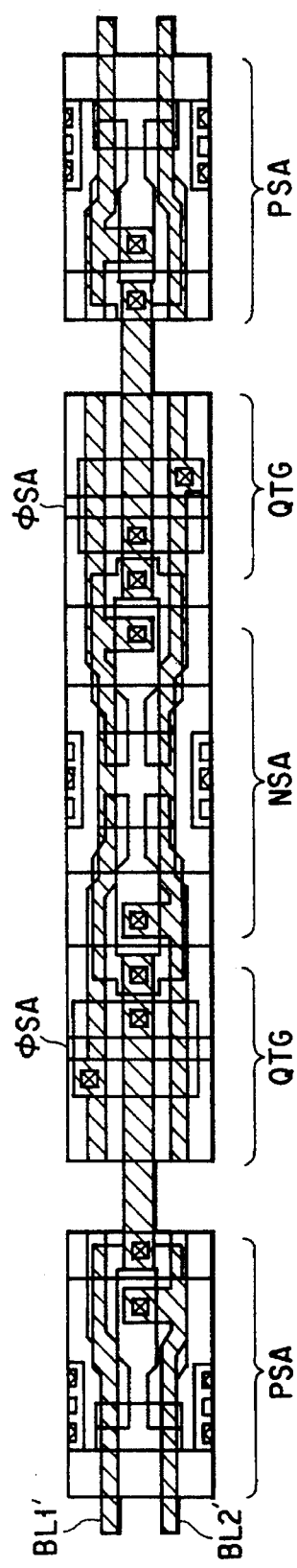
FIG. 21 is a layout view of the sense amplifier illustrated in FIG. 20.

FIG. 21 is a layout view illustrating the sense amplifier circuit illustrated in FIG. 20. Two transfer gates QTG are disposed between two sections of the sense amplifier PSA composed of the p-type transistors disposed being separated from each other and the sense amplifier NSA composed of the n-type transistors Qn is disposed between these two transfer gates QTG.

By making this disposition, it is possible to reduce the number of bit lines connecting the regions and also to reduce the chip area, as in the case of the embodiment of FIG. 8.

Figure 22:
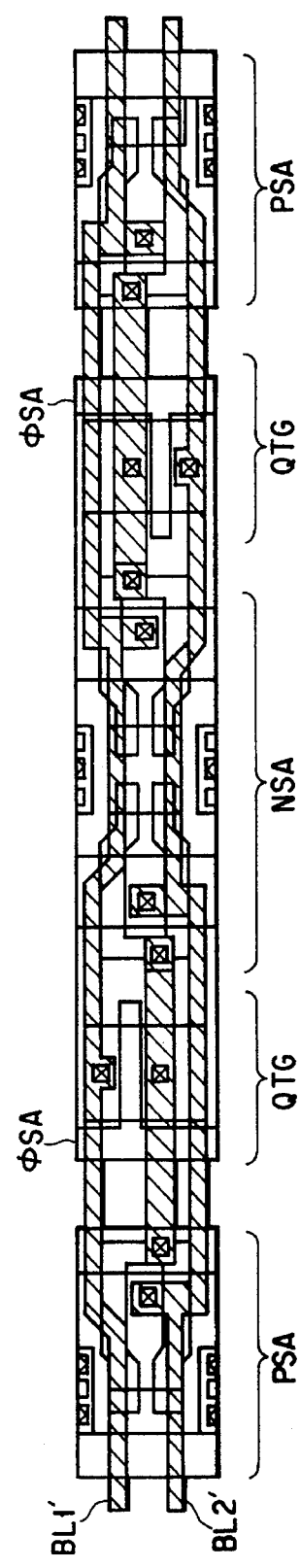
FIG. 22 is another layout view of the sense amplifier illustrated in FIG. 20.

FIG. 22 is another layout view illustrating the sense amplifier circuit illustrated in FIG. 20. The layout view of FIG. 22 differs from that of FIG. 21 only in that the gate pattern of the transfer gate QTG in FIG. 22 is modified from that of the transfer gate QTG in FIG. 21 and is completely the same as the layout view of FIG. 21 in other respects. By making this disposition, it is possible to reduce the number of bit lines connecting the regions and also to reduce the chip area, as in the case of the layout disposition made in FIG. 21.

EMBODIMENT 10

Next, examples of an element structure of the memory cell used in the present invention will be explained with reference to FIGS. 23A to 31B. In the figures hereinafter referred to, FIGS. 23A to 31A are plan views of the memory cell, taken from above the same and FIGS. 23B to 31B are sectional views of the memory cell, taken along the lines 23B—23B, and 31B—31B of FIGS. 23A to 31A.

EMBODIMENT 10-1

Figure 23A:
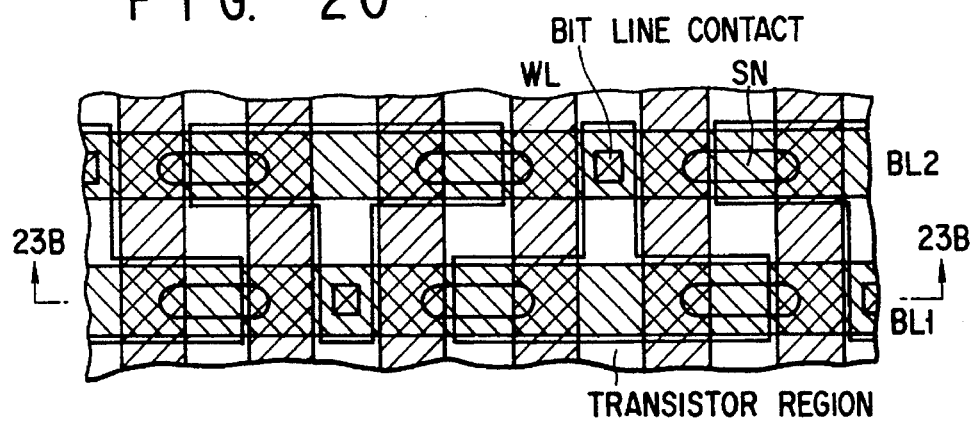
FIGS. 23A and 23B are a plan view and a sectional view illustrating the element structure of the memory cell according to a tenth embodiment.
Figure 23B:
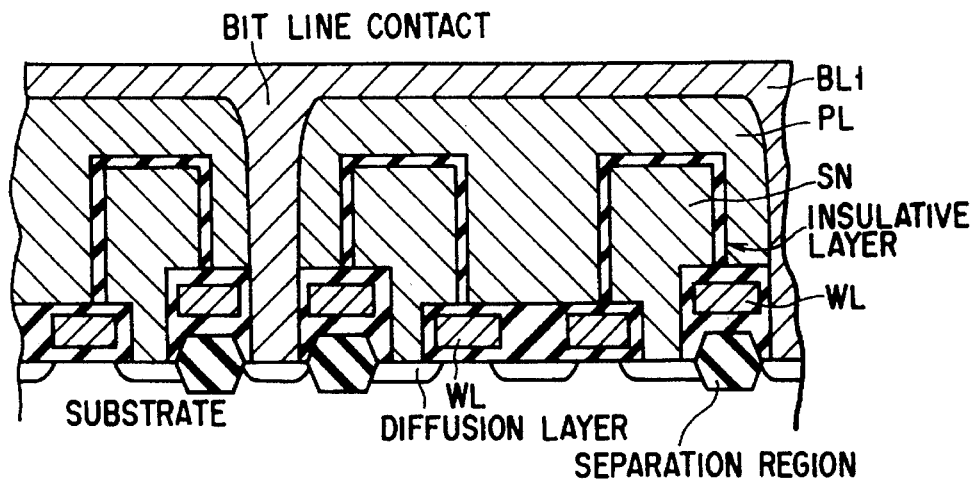

As illustrated in FIGS. 23A and 23B, symbols BL1 and BL2 represent bit lines, both of which form a bit line pair. A symbol SN represents a storage node and WL represents a word line.

The cell capacitor is formed beneath the bit line. One terminal PL thereof is connected to the bit line located above this terminal and the other terminal SN is connected to a diffusion layer (source) of the cell transistor. As illustrated in FIG. 23A, a diffusion layer forming the drain of the cell transistor is formed in such a manner as to extend up to a position below the bit line paired with the bit line to which one end of the cell capacitor is connected, and, at this position, this diffusion layer is connected to the bit line through a contact.

By making this construction, it becomes possible to realize an $8F^2$-sized signal quantity increased memory cell.

Figure 24A:
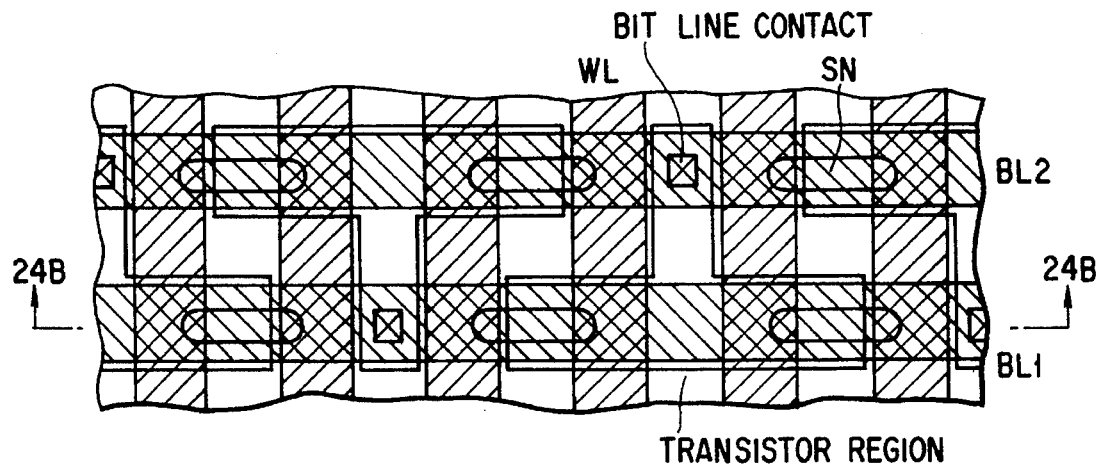
FIGS. 24A and 24B are a plan view and a sectional view illustrating the element structure of the memory cell according to the tenth embodiment.
Figure 24B:
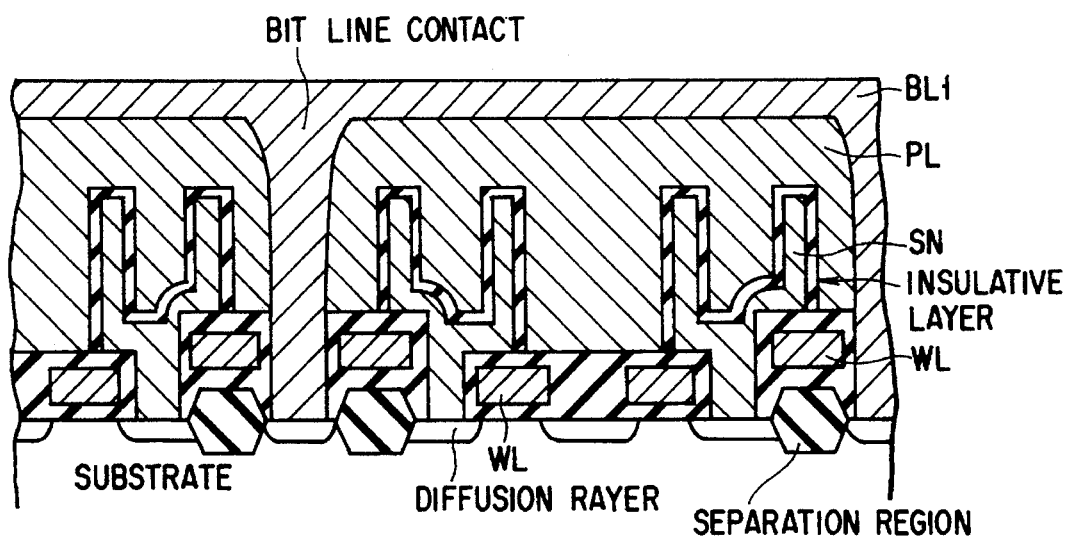
Figure 25A:
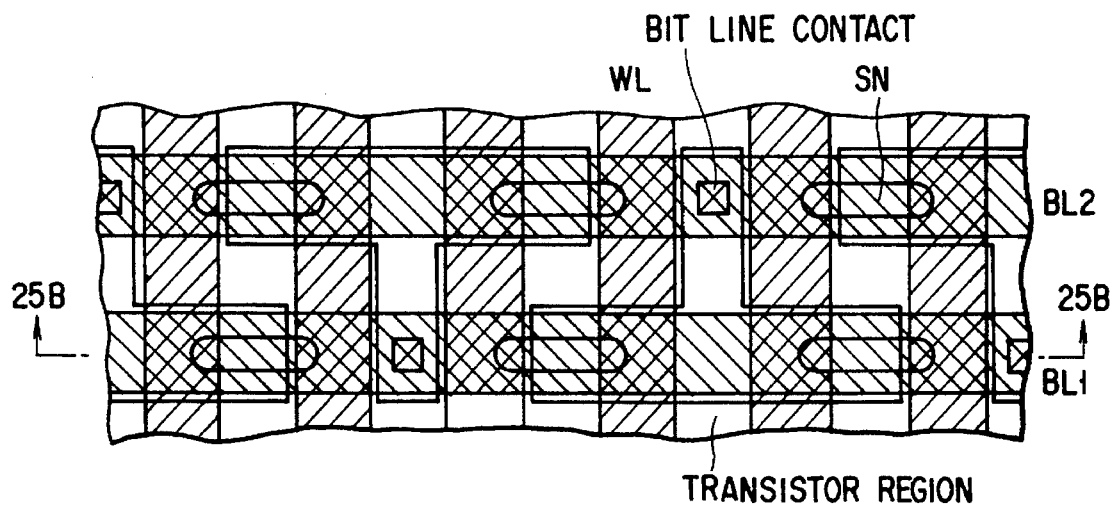
FIGS. 25A and 25B are a plan view and a sectional view illustrating the element structure of the memory cell according to the tenth embodiment.
Figure 25B:
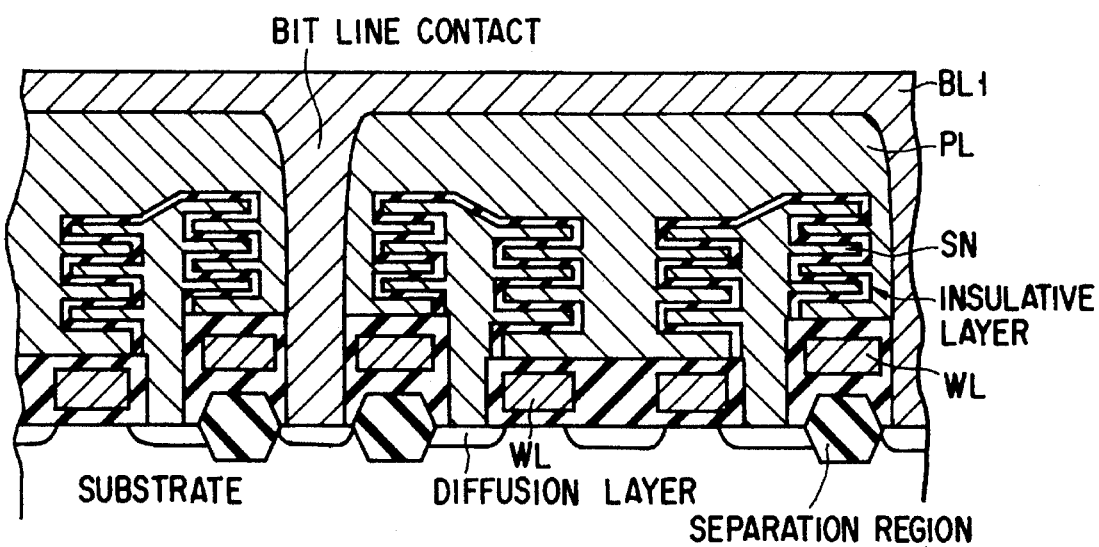

An example illustrated in FIGS. 24A and 24B is one prepared by modifying the configuration of the terminal SN of the example illustrated in FIGS. 23A and 23B into a so-called "crown" type configuration. An example illustrated in FIGS. 25A and 25B is one prepared by modifying the configuration of the terminal SN of the example illustrated in FIGS. 23A and 23B into a so-called "fin" type configuration.

EMBODIMENT 10-2

Figure 26A:
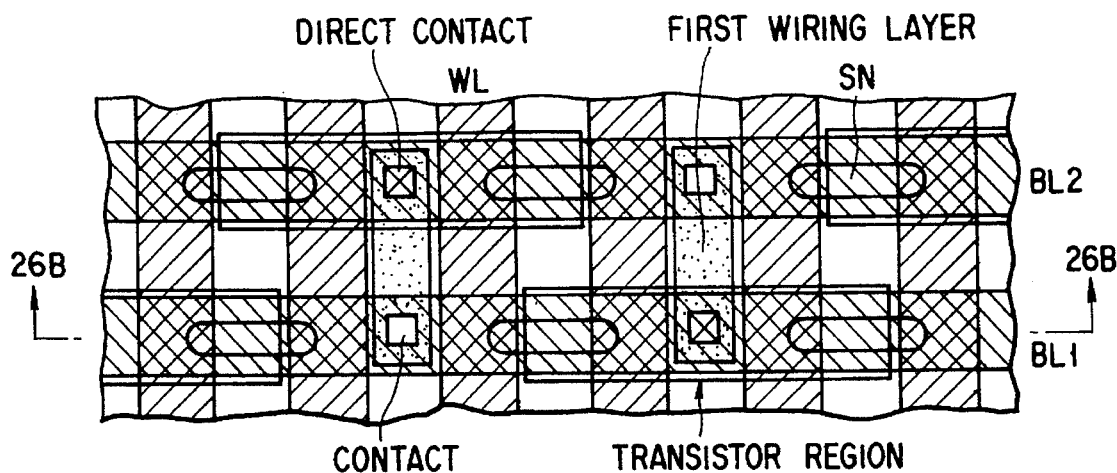
FIGS. 26A and 26B are a plan view and a sectional view illustrating the element structure of the memory cell according to the tenth embodiment.
Figure 26B:
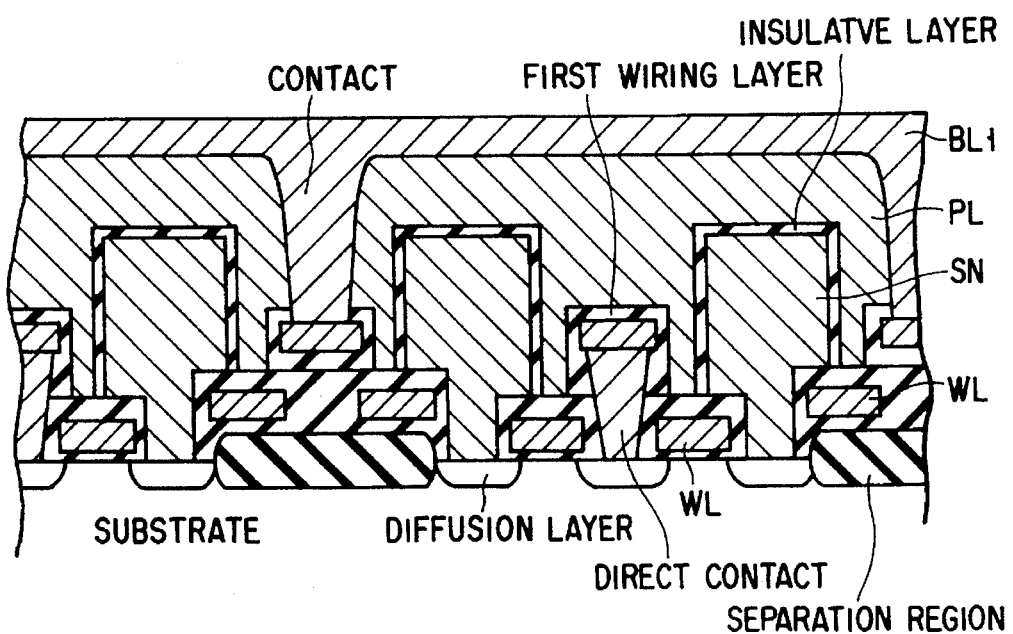

As illustrated in FIGS. 26A and 26B, symbols BL1 and BL2 represent bit lines, both of which form a bit line pair. A symbol SN represents a storage node and WL represents a word line.

The cell capacitor is formed beneath the bit line. One terminal PL thereof is connected to the bit line located above this terminal and the other terminal SN is connected to a diffusion layer (source) of the cell transistor. The drain of the cell transistor is connected to a first wiring layer through a direct contact, and the first wiring layer is connected to the bit line through a contact at a position below this bit line paired with the bit line located above the direct contact.

By making this construction, it becomes possible to realize an $8F^2$-sized signal quantity increased memory cell.

Figure 27A:
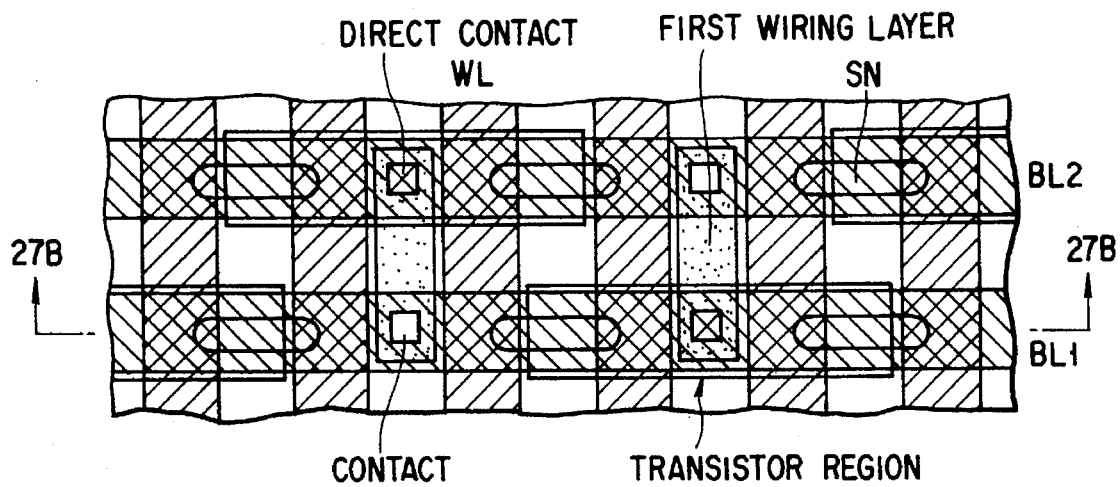
FIGS. 27A and 27B are a plan view and a sectional view illustrating the element structure of the memory cell according to the tenth embodiment.
Figure 27B:
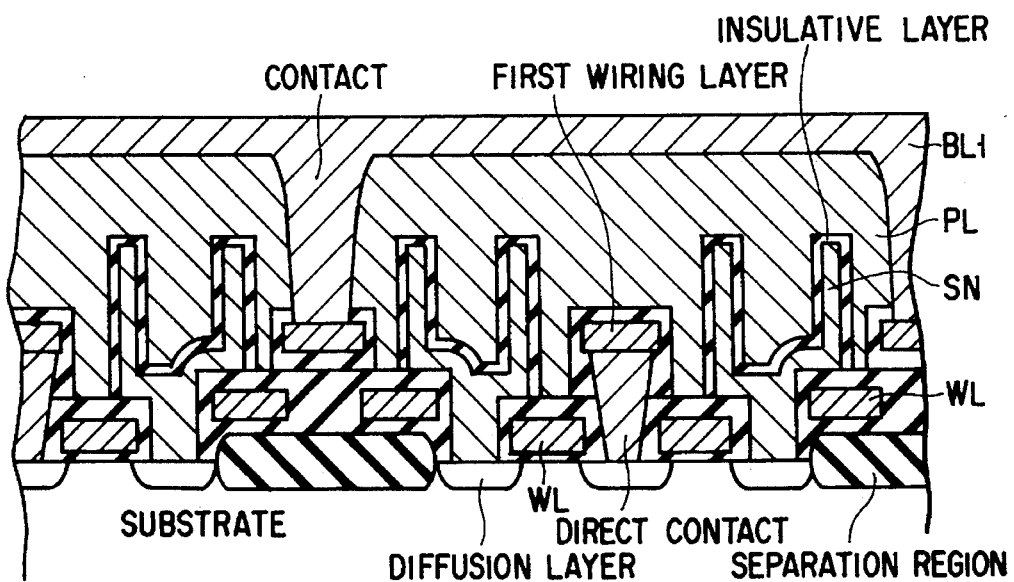
Figure 28A:
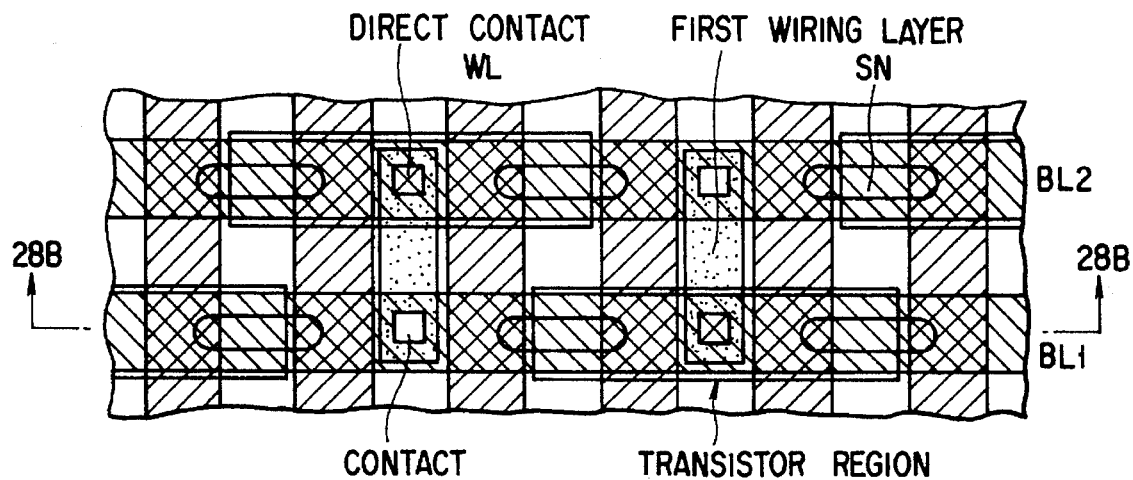
FIGS. 28A and 28B are a plan view and a sectional view illustrating the element structure of the memory cell according to the tenth embodiment.
Figure 28B:
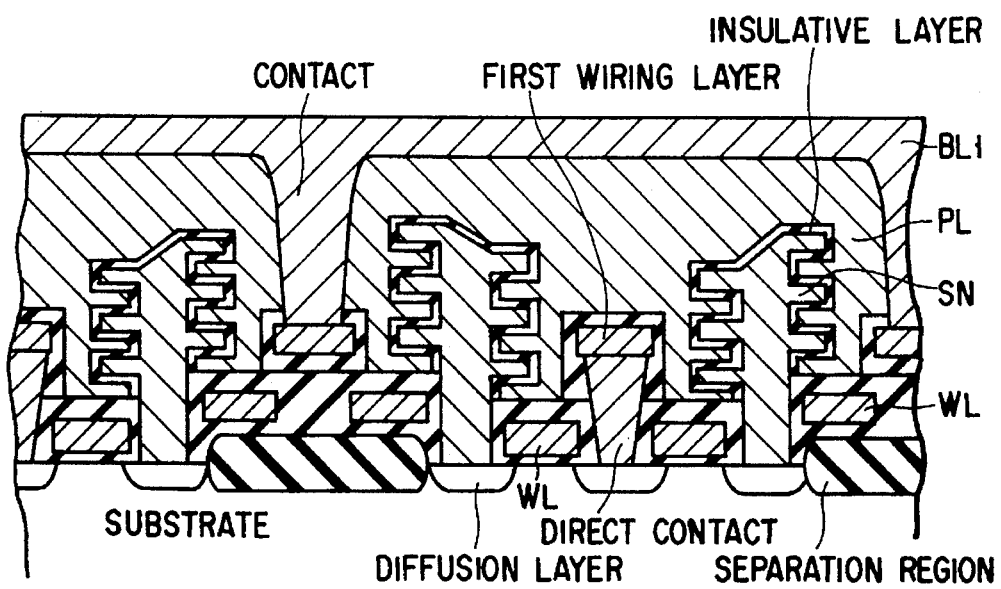

An example illustrated in FIGS. 27A and 27B is one prepared by modifying the configuration of the terminal SN of the example illustrated in FIGS. 26A and 26B into a so-called "crown" type configuration. An example illustrated in FIGS. 28A and 28B is one prepared by modifying the configuration of the terminal SN of the example illustrated in FIGS. 26A and 26B into a so-called "fin" type configuration.

EMBODIMENT 10-3

Figure 29A:
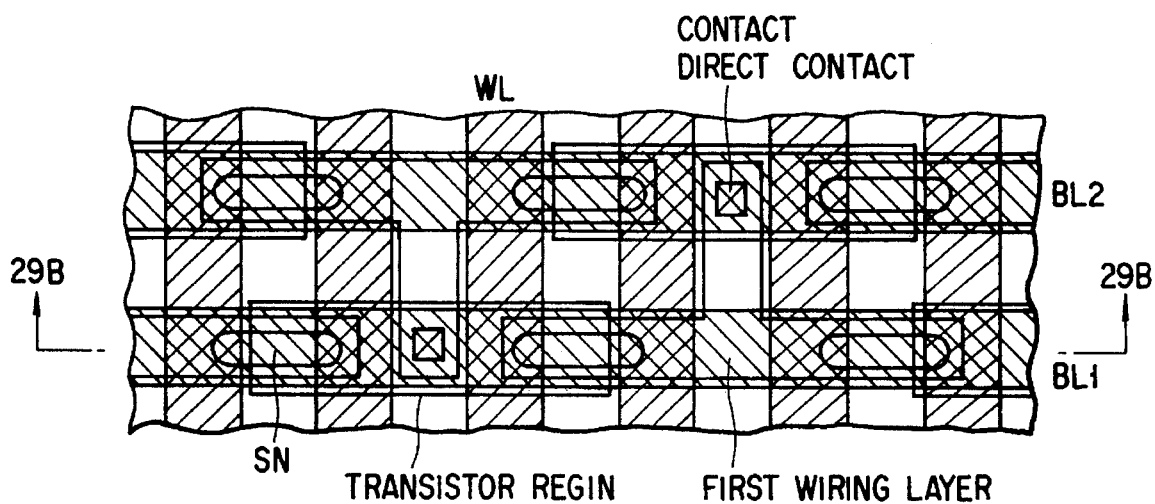
FIGS. 29A and 29B are a plan view and a sectional view illustrating the element structure of the memory cell according to the tenth embodiment.
Figure 29B:
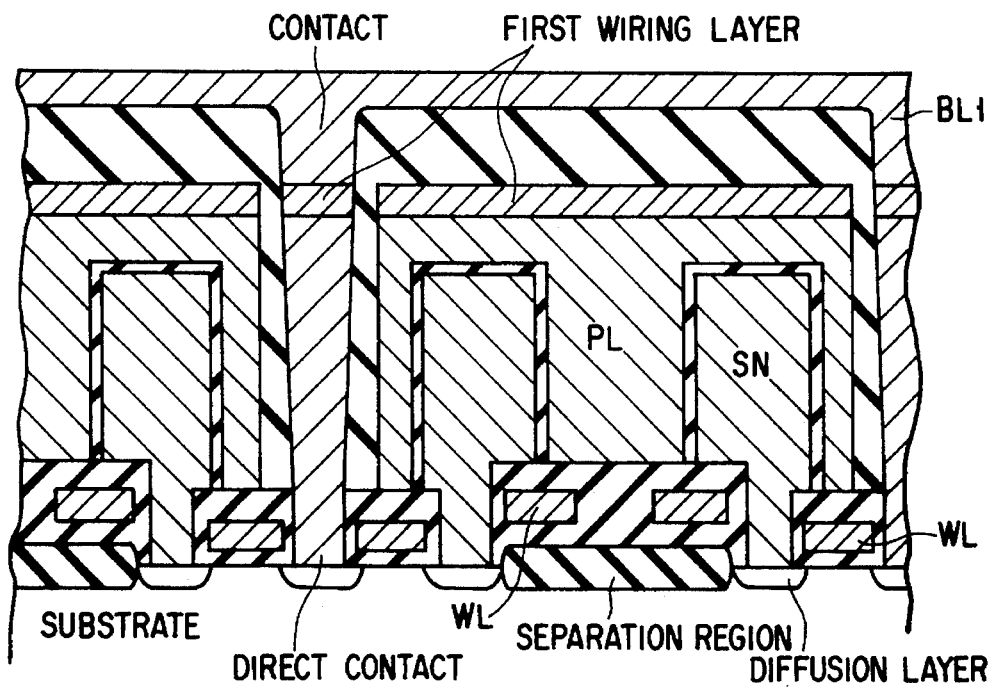

As illustrated in FIGS. 29A and 29B, symbols BL1 and BL2 represent bit lines, both of which form a bit line pair. A symbol SN represents a storage node and WL represents a word line.

The bit line and the drain of the cell transistor are connected to each other by means of a contact and a direct contact with a first wiring layer interposed therebetween. The cell capacitor is formed below the bit line. One terminal SN thereof is connected to a diffusion layer (source) of the cell transistor and the other terminal PL is connected to a T-shaped first wiring layer. The first wiring layer extends up to a position below the bit line paired with the bit line located above the cell capacitor and, at this position, is connected to the bit line through the direct contact. It is also connected to the drain of the cell transistor through the direct contact as mentioned above.

By making this construction, it becomes possible to realize an $8F^2$-sized signal quantity increased memory cell.

Figure 30A:
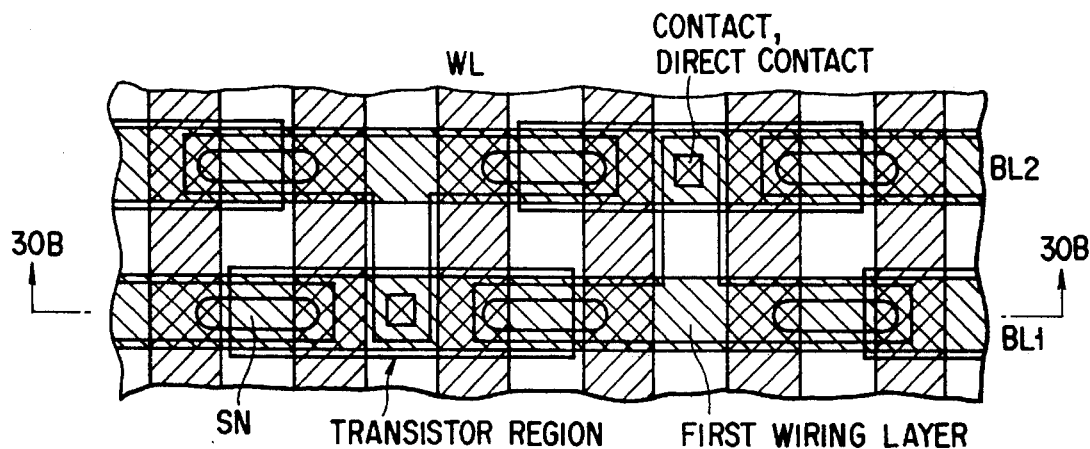
FIGS. 30A and 30B are a plan view and a sectional view illustrating the element structure of the memory cell according to the tenth embodiment.
Figure 30B:
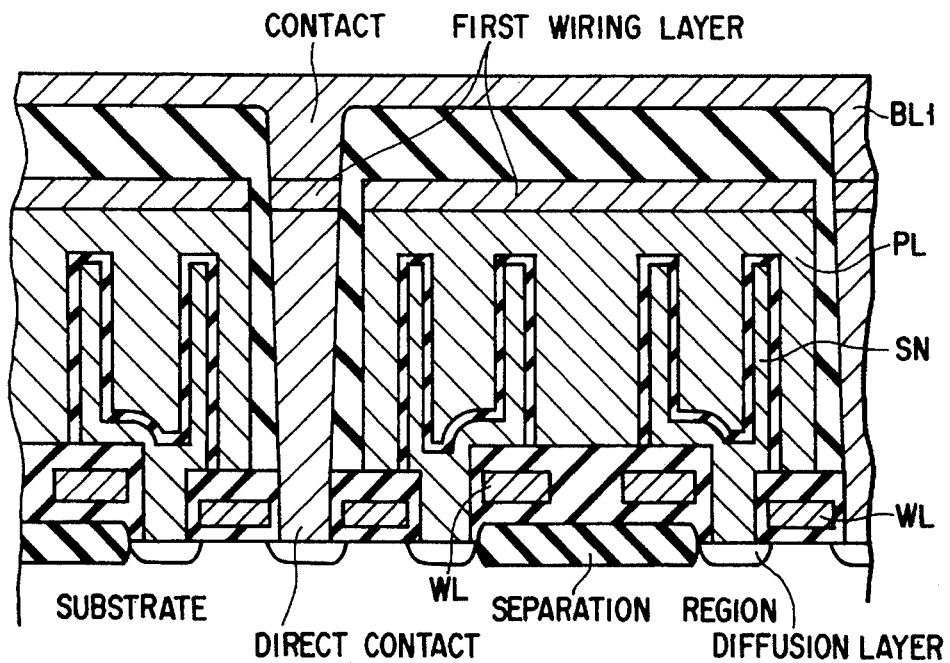
Figure 31A:
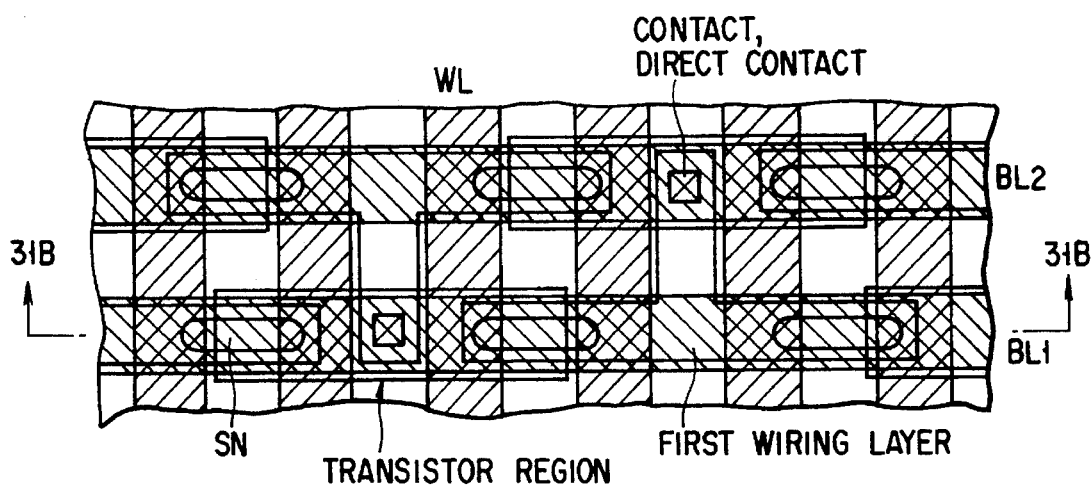
FIGS. 31A and 31B are a plan view and a sectional view illustrating the element structure of the memory cell according to the tenth embodiment.
Figure 31B:
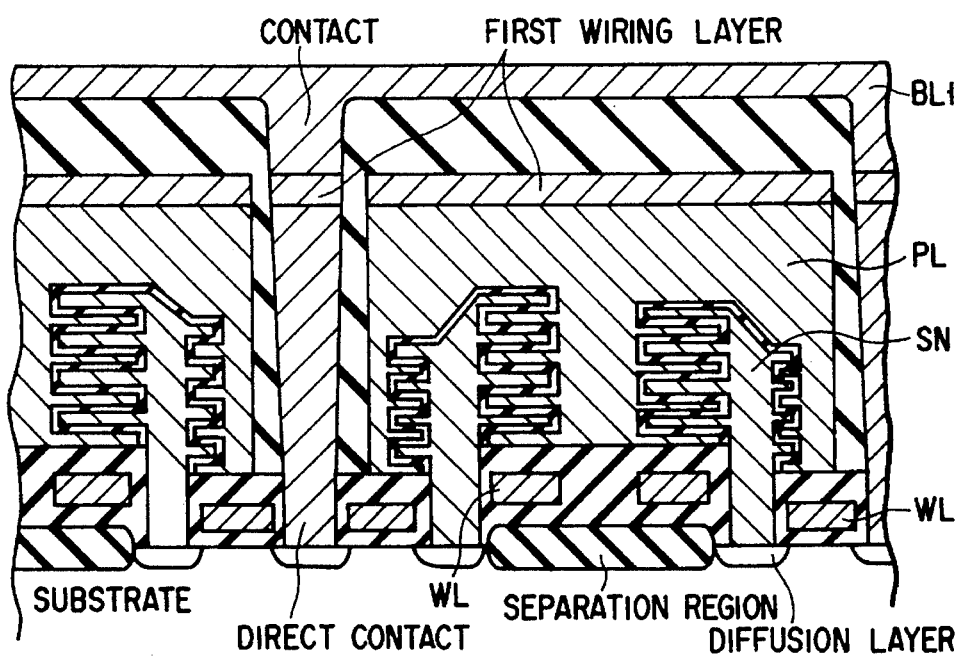

An example illustrated in FIGS. 30A and 30B is one prepared by modifying the configuration of the terminal SN of the example illustrated in FIGS. 29A and 29B into a so-called "crown" type configuration. Also, an example illustrated in FIGS. 31A and 31B is one prepared by modifying the configuration of the terminal SN of the example illustrated in FIGS. 29A and 29B into a so-called "fin" type configuration.

Note that the present invention is not limited to each of the above-mentioned embodiments but can be worked out by being variously modified without departing from the subject matter of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of word lines;
   a plurality of first bit line pairs disposed in a manner as to intersect the word lines and each having first and second bit lines;
   a memory cell array having a plurality of memory cells provided at intersection areas between the plurality of bit line pairs and the plurality of word lines and each consisting of one transistor and one capacitor;
   a plurality of second bit line pairs each having a third bit line connected to the first bit line through a first transfer gate and a fourth bit line connected to the second bit line through a second transfer gate; and
   flip-flop sense amplifier circuits each disposed between respective paired second bit lines of the plurality of second bit line pairs and each composed of a first p-type transistor and a first n-type transistor whose gates are commonly connected and a second p-type transistor and a second n-type transistor whose gates are commonly connected, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, the respective gates of the first p-type and first n-type transistors being connected to the fourth bit line through a third transfer gate, and the respective gates of the second p-type and second n-type transistors being connected to the third bit line through a fourth transfer gate.

2. A semiconductor memory device according to claim 1, wherein the first and second n-type transistors are disposed being separated from each other in the direction of the bit lines, the third and fourth transfer gates are disposed being separated from each other in the direction of the bit lines between the first and second n-type transistors, and the first and second p-type transistors are disposed between the third and fourth transfer gates.

3. A semiconductor memory device according to claim 1, wherein the first and second p-type transistors are disposed being separated from each other in the direction of the bit lines, the third and fourth transfer gates are disposed being separated from each other in the direction of the bit lines, between the first and second p-type transistors, and the first and second n-type transistors are disposed between the third and fourth transfer gates.

4. A semiconductor memory device according to claim 1, wherein a connection node of the first n-type and p-type transistors and the third transfer gate and a connection node of the second p-type and n-type transistors and the fourth transfer gate are respectively set to Vcc or Vss in a rewriting operation.

5. A semiconductor memory device according to claim 1, wherein the memory cell has an SOI structure which is formed in a silicon layer on an insulative film.

6. A semiconductor memory device according to claim 1, wherein the first and second bit lines consisting one of the plurality of first bit line pairs intersect with each other and the third and fourth bit lines consisting one of the plurality of second bit line pairs intersect with each other.

7. A semiconductor memory device according to claim 1, wherein the memory cell has an SGT structure which is formed by stacked transistor.

8. A semiconductor memory device comprising:
   a plurality of word lines;
   a plurality of first bit line pairs disposed in a manner as to intersect the word lines and each having first and second bit lines;
   a memory cell array having a plurality of memory cells provided at intersection areas between the plurality of bit line pairs and the plurality of word lines and each consisting of one transistor and one capacitor;
   a plurality of second bit line pairs each having a third bit line connected to the first bit line of the memory cell array through a first transfer gate and a fourth bit line connected to the second bit line through a second transfer gate,
   flip-flop sense amplifier circuits each disposed between respective paired second bit lines of the plurality of second bit line pairs and each composed of a first p-type transistor and a first n-type transistor whose gates are commonly connected to the fourth bit line and a second p-type transistor and a second n-type transistor whose gates are commonly connected to the third bit line, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, and inverter circuit composed of a third p-type transistor and a third n-type transistor having the drains commonly connected to the first bit line connected to the third bit line through the first transfer gate and the gates commonly connected to the fourth bit line and a fourth p-type transistor and a fourth n-type transistor having the drains commonly connected to the second bit line connected to the fourth bit line through the second transfer gate and the gates commonly connected to the third bit line, respective sources of the third and fourth p-type transistors being connected to a third sense amplifier drive line while, on the other hand, respective sources of the third and fourth n-type transistors are connected to a fourth sense amplifier drive line.

9. A semiconductor memory device according to claim 8, wherein the memory cell has an SOI structure which is formed in a silicon layer on an insulative film.

10. A semiconductor memory device according to claim 8, wherein the first and second bit lines consisting one of the plurality of first bit line pairs intersect with each other and the third and fourth bit lines consisting one of the plurality of second bit line pairs intersect with each other.

11. A semiconductor memory device according to claim 8, wherein the memory cell has an SGT structure which is formed by stacked transistor.

12. A semiconductor memory device comprising:

a plurality of word lines;

a plurality of first bit line pairs disposed in a manner as to intersect the word lines and each having first and second bit lines;

a memory cell array having a plurality of memory cells provided at intersection areas between the plurality of bit line pairs and the plurality of word lines and each consisting of one transistor and one capacitor, the gate of the transistor being connected to the word line, the drain thereof being connected to the first bit line, and the source thereof being connected to a first terminal of the capacitor while, on the other hand, a second terminal of the capacitor is connected to the second bit line;

a plurality of second bit line pairs each having a third bit line connected to the first bit line through a first transfer gate and a fourth bit line connected to the second bit line through a second transfer gate; and flip-flop sense amplifier circuits each disposed between respective paired second bit lines of the plurality of second bit line pairs and each composed of a first p-type transistor and a first n-type transistor whose gates are commonly connected and a second p-type transistor and a second n-type transistor whose gates are commonly connected, respective drains of the first p-type transistor and the first n-type transistor being connected to the third bit line, respective drains of the second p-type transistor and the second n-type transistor being connected to the fourth bit line, respective sources of the first and second p-type transistors being connected to a first sense amplifier drive line, respective sources of the first and second n-type transistors being connected to a second sense amplifier drive line, the gate of the first p-type transistor being connected to the fourth bit line through a third transfer gate while, on the other hand, the gate of the second p-type transistor is connected to the third bit line through a fourth transfer gate.

13. A semiconductor memory device according to claim 12, wherein the memory cell has an SOI structure which is formed in a silicon layer on an insulative film.

14. A semiconductor memory device according to claim 12, wherein the first and second bit lines consisting one of the plurality of first bit line pairs intersect with each other and the third and fourth bit lines consisting one of the plurality of second bit line pairs intersect with each other.

15. A semiconductor memory device according to claim 12, wherein the memory cell has an SGT structure which is formed by stacked transistor.

* * * * *